(12) United States Patent
Watanabe

(10) Patent No.: US 8,174,522 B2
(45) Date of Patent: May 8, 2012

(54) THREE-DIMENSIONAL (3D) STRUCTURE DATA CREATION METHOD, 3D STRUCTURE DATA CREATION APPARATUS, COMPUTER-READABLE RECORD MEDIA AND COMPUTER SYSTEM

(75) Inventor: Hiroshi Watanabe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1048 days.

(21) Appl. No.: 12/052,198

(22) Filed: Mar. 20, 2008

(65) Prior Publication Data
US 2009/0006039 A1  Jan. 1, 2009

(30) Foreign Application Priority Data

Jun. 28, 2007 (JP) ................................. 2007-170111

(51) Int. Cl.
*G06T 15/00* (2011.01)
(52) U.S. Cl. .............. 345/419; 345/57; 345/59; 345/66; 345/98; 257/59; 257/72
(58) Field of Classification Search .................... 345/57, 345/59, 66, 98, 419; 257/59, 72
See application file for complete search history.

(56) References Cited

U.S. PATENT DOCUMENTS

| | | | | |
|---|---|---|---|---|
| 6,380,560 B1 * | 4/2002 | Yamazaki et al. | ............... | 257/72 |
| 7,138,658 B2 * | 11/2006 | Yamazaki et al. | ............... | 257/72 |
| 7,256,760 B2 * | 8/2007 | Yamazaki et al. | ............... | 345/98 |

FOREIGN PATENT DOCUMENTS

| | | |
|---|---|---|
| JP | 03-13644 | 6/1991 |
| JP | 3-136344 | 6/1991 |
| JP | 10-320556 | 12/1998 |

OTHER PUBLICATIONS

Owada et al.; "Volumetric Illustration: Designing 3D Models With Internal Textures", Proc. Siggraph, pp. 322-328, (2004).
Notification of Reason(s) for Refusal issued by the Japanese Patent Office on Jan. 24, 2012, for Japanese Patent Application No. 2007-170111, and English-language translation thereof.
Ito et al., "The analysis of semiconductor device used Dual-axis TEM tomography," Extended Abstracts, The Japan Society of Applied Physics (The 66th Autumn Meeting) (2005), p. 698.
Sato, "Three-dimensional re-formation of transmission electron microscope image(s) by computerized tomography," Vacuum Journal (Jul. 2003), pp. 17-21.
Inoke, "Application of Electron Beam Tomography Method for Material Development," Materia Japan (Aug. 20, 2006), 45:598-604.

* cited by examiner

*Primary Examiner* — Phu Nguyen
(74) *Attorney, Agent, or Firm* — Finnegan, Henderson, Farabow, Garrett & Dunner, L.L.P.

(57) ABSTRACT

A three-dimensional (3D) structure data creation technique capable of readily creating 3D structure data is disclosed. This method is for producing data of a 3D structure which is made up of a plurality of elements. The method includes the steps of preparing first and second two-dimensional (2D) sectional images different in normal vector from each other, forming first and second unit graphics based on these 2D images, partitioning each unit graphic on a per-element basis, performing layout arrangement of two unit graphics in accordance with normal vectors, expanding these unit graphics for conversion to 3D objects, and allocating a selected element to a region in which elements of the unit graphics failing to coincide with each other, which region is included in and specified from those regions with intersection of respective partitioned parts of the unit graphics, thereby to create the 3D structure data required.

20 Claims, 28 Drawing Sheets

No Retouching

Floating Gate.

Retouching Applied

THREE-DIMENSIONAL (3D) STRUCTURE DATA CREATION METHOD, 3D STRUCTURE DATA CREATION APPARATUS, COMPUTER-READABLE RECORD MEDIA AND COMPUTER SYSTEM

CROSS-REFERENCE TO RELATED APPLICATION

This application is based upon and claims the benefit of priority from the prior Japanese Patent Application No. 2007-170111, filed Jun. 28, 2007; the entire contents of which are incorporated herein by reference.

FIELD OF THE INVENTION

The present invention relates to a three-dimensional (3D) structure graphics data creation technique for use in computer-aided design (CAD) of semiconductor integrated circuit devices. The invention also relates to a computer program for the 3D structure data creation and a recording medium used therefor.

DESCRIPTION OF RELATED ART

Currently, methodology for performing structure design through simulation prior to actual manufacture, called the technology computer-aided design (TCAD), is widely used in the development of semiconductor device products. Generally TCAD includes three major stages: process simulation, device simulation, and circuit simulation. An example of the device simulation is disclosed in JP-A H03-136344 (KOKAI).

A brief explanation will here be given of the circuit simulation, which has yielded good results. Currently available large-scale integration (LSI) devices are designed to have several millions or billions of transistors on a semiconductor substrate. Obviously, LSI circuitry does not operate with the use of such transistors only. It further includes many other circuit elements in addition to the transistors, such as resistors, capacitors, power supply circuitry, current sources, and electrical interconnect wires.

For implementation of the circuit simulation of an LSI device which includes such the great number of elements, it becomes necessary to replace each element by a compact model to thereby alleviate the workload of the central processing unit (CPU) of a simulator. The compact model includes many parameters. These parameters are adjusted in such a way as to replicate or "mimic" the actual operation of each circuit element, such as a transistor or the like.

Semiconductor devices for use as the elements making up an LSI circuit decrease in minimum feature size whenever the LSI technology experiences a change between generations. For this reason, the devices are encountered with risks of an increased number of physical phenomena affecting device operations, such as quantum effects and many-body effects. Furthermore, as the physical phenomena exhibit mutual interaction, mere use of the parameters that are extracted from those devices of the precedent or "old" generation would result in a situation where the device characteristics of LSIs of the next generation are no longer reproducible.

It is thus required to perform extraction of parameters with respect to each generation of LSIs—that is, calibration. In some cases, the compact model per se is needed to be updated. In this way, a further increased number of parameters are added to compact models that have been reedited on a per-generation basis in order to deal with more complicated physical phenomena. Note here that the calibration refers to a procedure for adjustment of the compact model parameters in such a way as to reproduce the actually measured physical and electrical properties of a prototype semiconductor device, which is prepared prior to the actual manufacture of LSI circuits.

When the parameters increase in number as the physical phenomena become more complex with advances in miniaturization of semiconductor devices, the calibration increases in process complexity. Once the calibration is completed, resultant compact models obtained based on this calibration are used to perform LSI circuit simulation. Accordingly, the compact model calibration is very important for development of LSI products.

Another aspect of the semiconductor device downscaling is that the device characteristics increase in dependency on shapes. This shape dependency of the device characteristics will be explained with reference to FIGS. 26A-26B and 27A-27B. FIG. 26A illustrates, in cross-section, a transistor of the previous generation, which is relatively large in size. FIG. 26B depicts in cross-section a transistor of the next generation under development, which is small in size. As shown herein, any one of these transistors has a gate which lacks lower corner portions on its source and drain sides. These corner-lacked gate portions are the same in size for the both transistors. However, the transistor of FIG. 26B is larger than that of FIG. 26A in influence upon device characteristics because the former is larger than the latter in ratio of the cutaway gate part to gate length L.

FIGS. 27A and 27B are diagrams for explanation of the fact that the shape dependency of device characteristics are based on the 3D shape of a device. FIGS. 27A and 27B are sectional views of the transistors shown in FIGS. 26A and 26B, respectively, in a direction perpendicular to the cross-sections of FIGS. 26A-26B. The transistors of FIGS. 27A-B are such that each has an active region which is laterally interposed between insulator-buried grooves for shallow trench isolation (STI), wherein the active region is partly cut away, resulting the gate width W becoming narrower. This gate width reduction results in a decrease in drain current. This drain current reduction effect tends to increase with advances in device miniaturization.

In view of the presence of both the influenceability in the gate length direction of FIGS. 26A-26B and the influence in the gate width direction of FIGS. 27A-B, it can be seen that the shape dependency of device characteristics is based on the 3D shape of device. It should be noted that although the cross-sectional structures of FIGS. 26A-27B are illustrated to have simplified shapes, actually manufactured devices are more complicated in 3D shape. Thus, the shape dependency of device characteristics also becomes more complicated.

A more serious problem concerning the shape dependency of the device characteristics is as follows: with advances in miniaturization, the device characteristics become greater in deviation occurring due to the irregularity of shapes. This problem will be discussed while referring to FIGS. 28A to 28C. FIGS. 28A-28C illustrate cross-sectional transistor structures in the same direction as that of FIGS. 26A-26B. The transistor of FIG. 28B is the same in shape as the transistor of FIG. 26B. The transistors shown in FIGS. 28A and 28C are the ones that are irregularly varied in gate shape from the transistor shown in FIG. 28B.

The shape variations shown in FIGS. 28A and 28C have been found in semiconductor devices of the large-size generation. However, deviation in device characteristics induced by such shape variations have stayed negligibly less since the "old" devices are large in size and, for the very reason, their shape dependency remains negligible. As the gate length becomes shorter due to the growth in device miniaturization, any possible deviation of characteristics occurrable due to shape variations becomes no longer negligible. Obviously, such device shape variations can take place with respect to the gate width direction as well as the gate length direction, and this leads to the risk of occurrence of device characteristics deviation due to the shape variations in the gate width direction.

As the deviation of device characteristics occurring due to shape variations induced by device miniaturization becomes greater, the calibration using the actually measured device characteristics data of a prototype device sample can decrease in fitting accuracy thereof. This fitting accuracy reduction results in a likewise decrease in accuracy of circuit simulation.

As stated above, the deviation of the characteristics due to shape variations becomes no longer negligible as the device miniaturization advances. Accordingly, in order to perform the circuit simulation successfully, a need is felt to build up a compact model which takes thereinto any possible 3D shape variations as parameters.

However, further advances in device miniaturization brings an appreciable increase in production costs for trial fabrication of semiconductor devices. In view of this cost increase, for the establishment of a compact model with 3D shape variations taken thereinto as parameters, one considered approach is to acquire the required device characteristics data by execution of device simulation using 3D structure data of the device of interest in place of the actual measurement of a prototype device. In order to obtain the device characteristics data of high accuracy by such simulation, it is needed for the 3D structure data to have much similarity and fidelity to the real device. Thus, it is desired to provide a technique for readily creating the 3D structure data having maximal fidelity to real device shapes while reducing process complexities.

SUMMARY OF THE INVENTION

In accordance with one aspect of the present invention, a method for creating three-dimensional (3D) structural data of a 3D structure which is made up of a plurality of different elements is provided. This method includes the steps of preparing an image of a first two-dimensional (2D) cross-section of the 3D structure and an image of a second 2D cross-section of the 3D structure different in normal vector from the first 2D cross-section, forming a first unit graphic based on the first 2D cross-section image, forming a second unit graphic based on the second 2D cross-section image, partitioning the first unit graphic on a per-element basis, partitioning the second unit graphic on a per-element basis, performing layout arrangement of the first unit graphic and the second unit graphic in accordance with respective normal vectors, expanding or stretching the first unit graphic partitioned in the normal direction of the first cross-section image to thereby perform conversion into a 3D object, expanding the second unit graphic partitioned in the normal direction of the second cross-section image to thereby perform conversion to a 3D object, specifying, in regions with intersection of respective partitioned portions of the 3D-converted first unit graphic and respective partitioned portions of the 3D-converted second unit graphic, a region in which an element of the first unit graphic and an element of the second unit graphic coincide with each other for allocating thereto an identical element, and specifying another region in which an element of the 3D-converted first unit graphic and an element of the 3D-converted second unit graphic fail to coincide with each other in the regions with intersection of respective partitioned portions of the 3D-converted first unit graphic and respective partitioned portions of the 3D-converted second unit graphic, for selecting any one of the elements of the partitioned portions of the first and second unit graphics and for allocating a selected one to the above-noted another region.

In accordance with another aspect of this invention, a method for creating 3D structure data of a 3D structure which is configured from a plurality of different elements by use of a graphical user interface (GUI) includes the steps of visually displaying on a unit graphic creation screen an image of first 2D cross-section of the 3D structure and an image of second 2D cross-section of the 3D structure which is different in normal vector from the first 2D cross-section, forming, in response to receipt of range specification by a user, a first unit graphic based on the first 2D cross-section image and a second unit graphic based on the second 2D cross-section image, displaying the first and second unit graphics on a labeling processing screen for permitting the user to partition the first and second unit graphics on a per-element basis, performing layout positioning of the first and second unit graphics in accordance with respective normal vectors thereof, expanding the partitioned first unit graphic in the normal direction of the first 2D cross-section image to thereby convert it into a 3D object, expanding the partitioned second unit graphic in the normal direction of the second 2D cross-section image to thereby convert it to a 3D object, specifying, in regions with intersection of respective partitioned portions of the 3D-converted first unit graphic and respective partitioned portions of the 3D-converted second unit graphic, a region in which an element of the first unit graphic and an element of the second unit graphic coincide with each other, for allocating thereto an identical element in an automated way, and allowing the user to select on a retouching processing screen either one of elements of the partitioned portions of the first and second unit graphics to thereby allocate the selected one to another region in which an element of the 3D-converted first unit graphic and an element of the 3D-converted second unit graphic fail to coincide with each other in the regions with intersection of respective partitioned portions of the 3D-converted first unit graphic and respective partitioned portions of the 3D-converted second unit graphic.

In accordance with still another aspect of the invention, a 3D structure data creation apparatus for aiding a user by use of GUI in a process of creating 3D structure data of a 3D structure which is made up of a plurality of different elements is provided. This apparatus includes a unit graphic creation screen generation/display device for visually displaying an image of first 2D cross-section of the 3D structure and an image of second 2D cross-section of the 3D structure which are different in normal vector from each other, and for enabling, in response to range specification by a user, creation of a first unit graphic based on the first 2D cross-section image and creation of a second unit graphic based on the second 2D cross-section image, a labeling processing screen generation/display device for displaying the first and second unit graphics and for enabling the user to partition the first and second unit graphics on a per-element basis, a 3D conversion device for performing layout arrangement of the first and second unit graphics in accordance with respective normal vectors thereof, for expanding the partitioned first unit graphic in a normal line direction of the first cross-section image to thereby convert it into a 3D object, and for expanding the partitioned second unit graphic in a normal line direction of the second cross-section image to thereby convert it to a 3D object, an automatic allocation device for automatically allocating an identical element to a region out of those regions with intersection of respective partitioned portions of the 3D-converted first unit graphic and respective partitioned portions of the 3D-converted second unit graphic, in which region an element of the first unit graphic and an element of the second unit graphic coincide with each other, and a retouching processing screen generation/display device for enabling the user to allocate to a region in the regions with intersection of respective partitioned portions of the 3D-converted first unit graphic and respective partitioned portions of the 3D-converted second unit graphic, in which region elements of the first and second unit graphics fail to coincide with each other, either one of the elements of the first and second unit graphics, which is selected by the user.

DETAILED DESCRIPTION OF THE EMBODIMENTS

Figure 1:
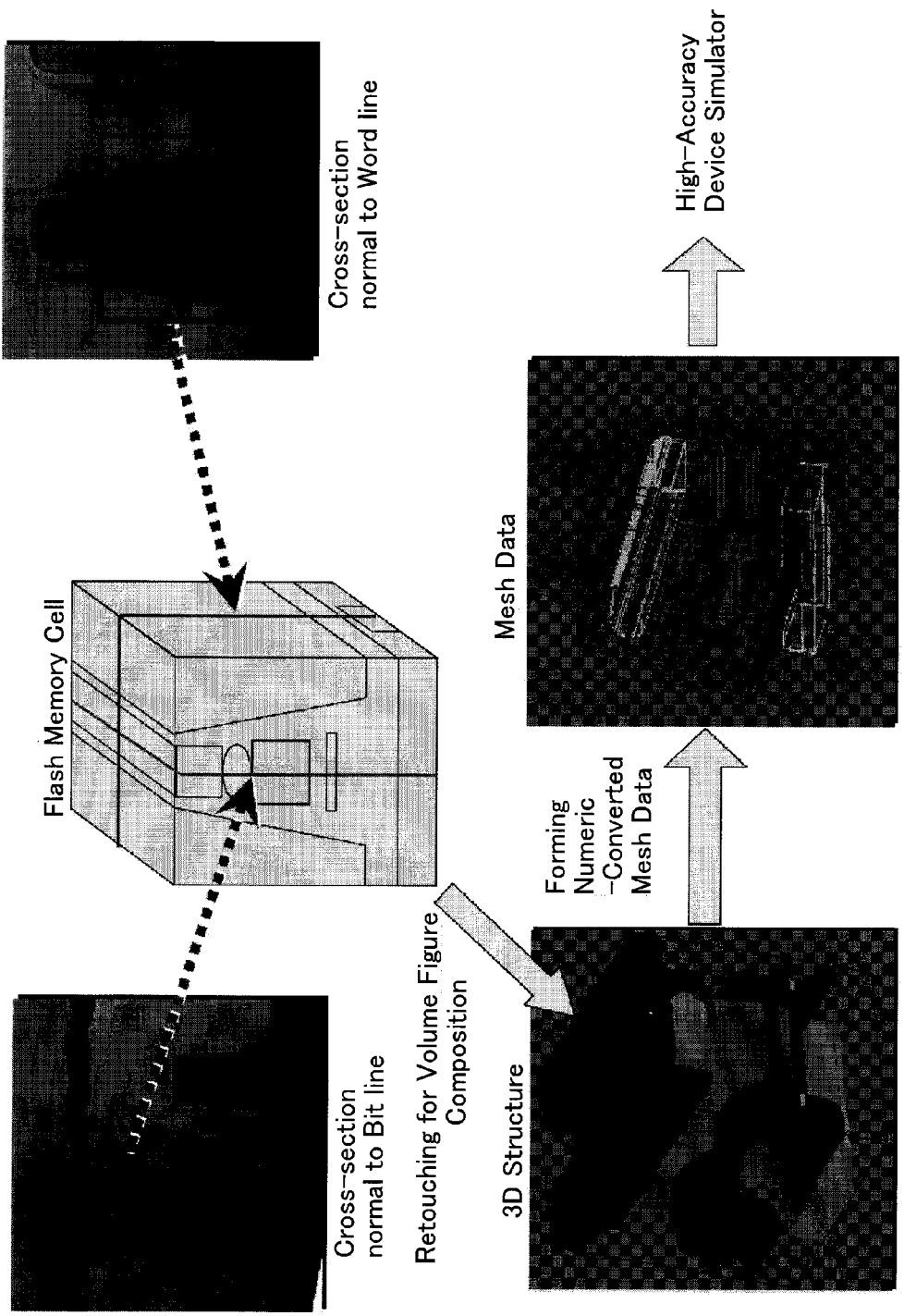
FIG. 1 is a diagram for explanation of principal concepts of a 3D structure data creation method in accordance with first embodiment of this invention.

Embodiments of this invention will be described with reference to the accompanying figures of the drawing below. Note here that in this description, the term "graphical user interface (GUI)" as used herein refers to a user interface which employs many kinds of graphic images to visually display information for a user in such a way as to allow the user to perform most manual operations by using a pointing device, such as a "mouse" or else. A screen like a window to be displayed with the aid of GUI will be called the GUI screen.

First Embodiment

A three-dimensional (3D) structure data creation method in accordance with first embodiment of this invention is the one that forms data of a 3D nanoscale device structure which is made up of a plurality of different types of elements. The 3D structure data creation in this embodiment is performed in a way which follows. Firstly, prepare an image of a first two-dimensional (2D) cross-sectional plane of the 3D structure (a first 2D cross-section image) and an image of a second 2D sectional plane (a second 2D cross-section image) which is different in normal vector from the first 2D sectional plane. In this specification, a normal vector means a vector normal or perpendicular to a certain two-dimensional plane; e.g. a cross-section image of a 3D structure, a unit graphic. Then, based on the first 2D cross-sectional image, a first unit graphic is formed. A second unit graphic is formed based on the second 2D sectional image. Next, the first unit graphic is partitioned on a per-element basis, and the second unit graphic also is partitioned on a per-element basis. Then, the first unit graphic and the second unit graphic are subjected to positioning for layout arrangement in accordance with respective normal vectors thereof. Then, the resulting first unit graphic thus partitioned is converted into a 3D object by expanding or stretching it in the normal line direction of the first sectional diagram. Similarly, the second unit graphic partitioned is converted into a 3D object by stretching it in the normal line direction of the second sectional diagram. In this specification, a normal direction means a direction normal or perpendicular to a certain two-dimensional plane; e.g. a sectional diagram, a sectional graphic. Then, from among those geometry regions with intersection of respective partitioned portions of the 3D-converted first unit graphic and respective partitioned portions of the 3D-converted second unit graphic, a certain region is specified, in which elements of the first and second unit graphics coincide with each other; then, this identical element is allocated to such the region. Next, in regard to another region in the regions with the intersection of respective partitioned portions of the 3D-converted first unit graphic and respective partitioned portions of the 3D-converted second unit graphic, in which region elements of the first and second unit graphics do not coincide with each other, either the element of the first unit graphic or the element of the second unit graphic is selected and allocated to the region.

Furthermore, in this embodiment, in order to make easier the above-noted 3D structure data creation, GUI is used to provide enhanced user assistance. Additionally in this embodiment, the 3D structure data is a mesh data which is loaded into and readable by a simulator.

Figure 2:
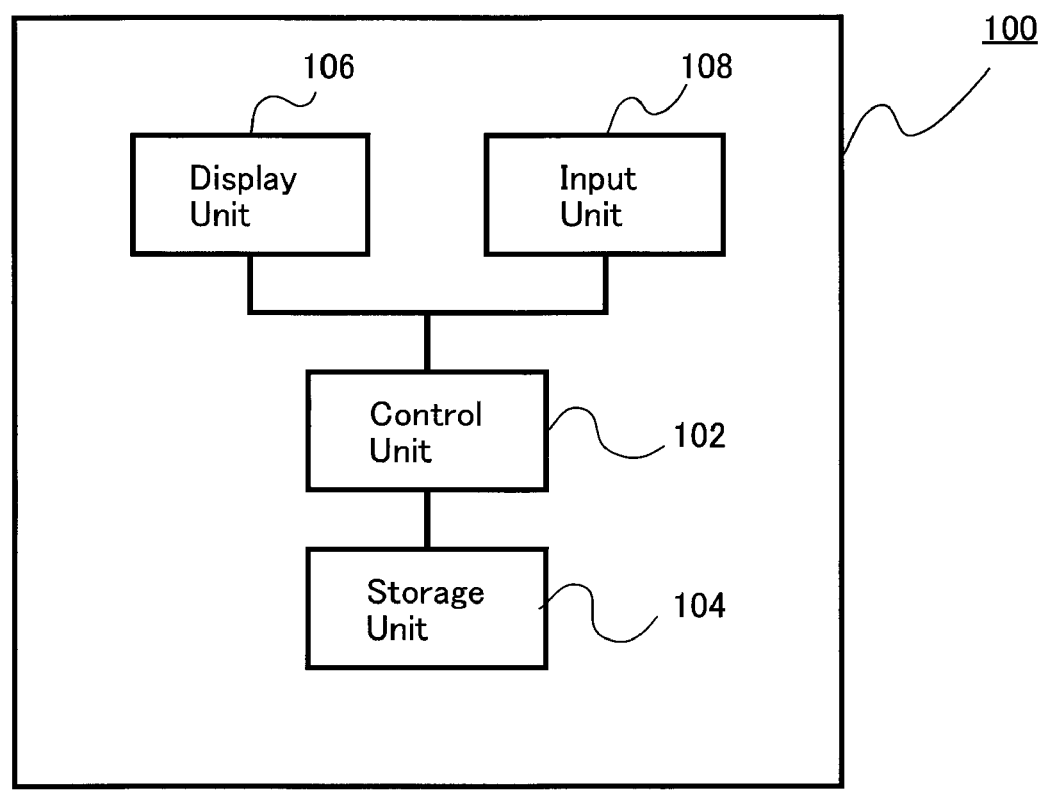
FIG. 2 is a block diagram showing schematically a configuration of a 3D structure data creation apparatus in regard to first and second embodiments of the invention.

FIG. 2 is a block diagram schematically showing the configuration of a 3D structure data creation apparatus for use in a technology computer aided design (TCAD) system, which is designed to execute the 3D structure data creation method of this embodiment. The 3D structure data creation apparatus is indicated by reference numeral 100 and is generally made up of a control unit 102, a storage unit 104, a display unit 106, and an input unit 108.

The control unit 102 has a central processor unit (CPU). The storage unit 104 is a file memory or the like, such as a read-only memory (ROM), random access memory (RAM), hard disk drive (HDD), or a flash memory. The storage unit 104 prestores therein an operating system (OS), a window system and various kinds of application programs along with data required by such programs. Each program is loaded into the RAM, for example, and is then executed by the CPU through its processing.

The display unit 106 is for visually displaying a GUI window screen, which is to be generated by the program that was executed by the CPU. An example of the display unit 106 is a liquid crystal display (LCD) device, which may be designed to have an LCD control circuit.

The input unit 108 is arranged by a keyboard, a mouse, an instrument with a set of hardware keys, a touch panel or like data entry equipments. When a key or keys are manually operated by a user, such as LSI chip designer, a program that processes an instruction specified by such key operation is executed by the control unit 102.

FIG. 1 is a diagram for explanation of basic concepts of the 3D structure data creation method of the first embodiment. Note that in this embodiment, an explanation will be given of the 3D structure that is constituted from a plurality of different on-chip circuit elements by taking as an example a memory cell of a flash memory of the floating-gate (FG) type.

What is done first is to take a transmission electron microscope (TEM) photograph of a flash memory cell in a cross-section which is cut in a direction perpendicular to a bit line (also referred to as the bit-line vertical cross-section hereinafter) and a TEM photograph of the memory cell in a cross-section that is cut in a direction at right angles to a word line (say, word-line vertical cross-section). In most cases, it is impossible to take two orthogonal cross-section photographs of the same flash memory cell at a time. Accordingly, the two TEM photographs may be taken from separate flash memory cells. Typically, the word line and the bit line cross each other at right angles, so it is considered that the above-noted two cross-sections also are at right angles to each other. However, it is principally not impossible to design a circuit having word lines and bit lines which obliquely cross each other. It is also not impossible in principle to take a TEM photograph at a cross-section which is not perpendicular to respective ones of the word and bit lines. Therefore, more generically speaking, the use of TEM photographs taken at two cross-sections that are different in normal vector from each other makes it possible to create 3D structure data. The above-stated case of perpendicular crossing or "intersection" refers to a special case where two normal vectors cross each other at right angles. In the semiconductor memory device art, there are customarily used in many cases the cross-section perpendicular to word lines and the cross-section at right angles to bit lines. In view of this, an explanation will be given by taking as an example the case of the cross-sections of interest being set to cross each other at right angles, that is, the case of the normal vectors of such cross-sections crossing each other at right angles. However, this invention should not be interpreted to be limited to this special case only.

Next, graphic images of a target solid object to be processed—here, memory cell—are cut away from the two TEM cross-section photographs, respectively. Each of these extracted zone images will be referred to hereinafter as the "unit graphic". In the TEM photograph of FIG. 1, portions which are encompassed by rectangular frames are comparable to the unit graphics extracted.

Next, a 3D structure graphic object image, which will be referred to as "volume graphic" hereinafter, is composed from the two separate unit graphics. This volume graphic is produced by a process having the steps of expanding the two unit graphics in their normal line directions respectively and then applying thereto 3D image conversion processing. In other words, each unit graphic is stretched in a coordinate axis direction which is in parallel with its associated unit graphic. Thereafter, the volume graphic obtained is applied a specific kind of processing, called the retouching, thereby to form a virtual 3D structure. Regarding the retouching, a detailed description will be given later in the description.

Next, the 3D structure thus formed is subjected to numerical conversion, i.e., digitization. By execution of mesh data creation, a set of mesh data is generated, which is readable into a simulator. Thereafter, the mesh data is sent as input data to a high-precision device simulator, which executes device simulation.

In this way, device characteristics are obtained by simulation based on the mesh data which replicates or mimics 3D shape information with high fidelity. Using the device characteristics, compact model calibration will be performed.

Figure 3:
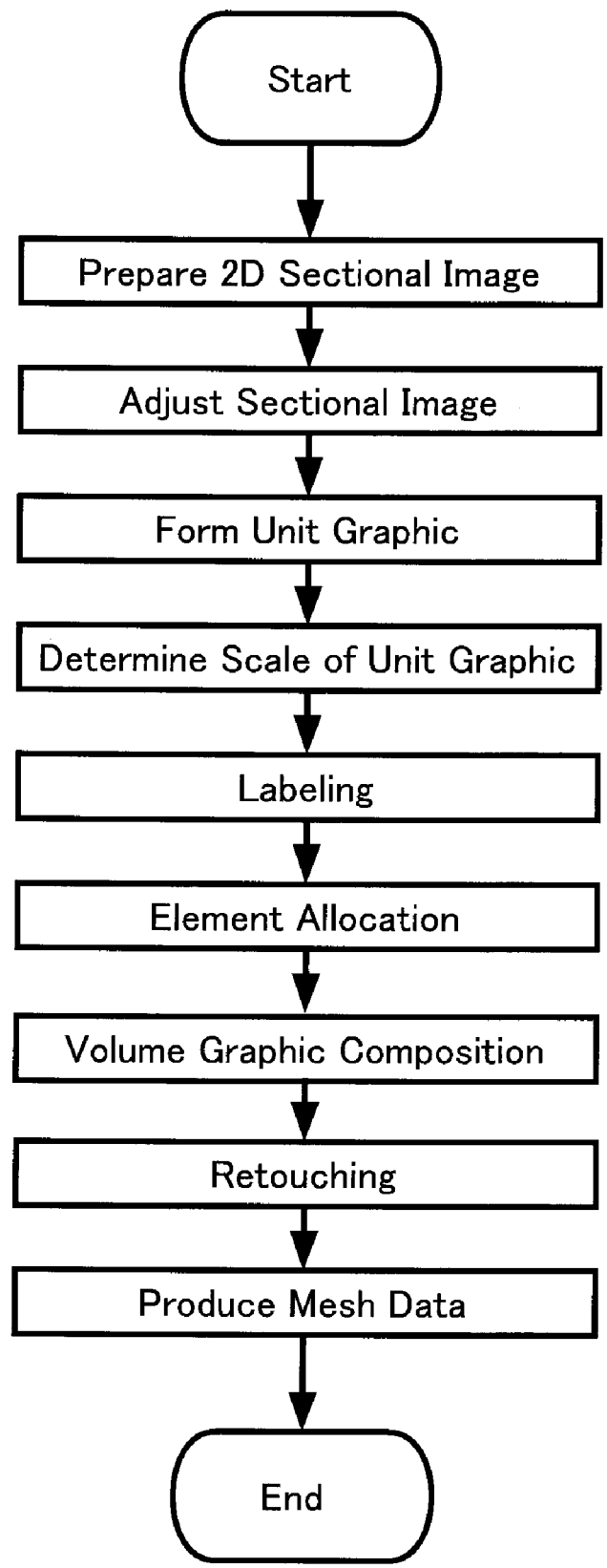
FIG. 3 is a flow chart of the 3D structure data creation method of the first embodiment.

FIG. 3 is a flow chart of the 3D structure data creation method of this embodiment. First, a couple of two-dimensional (2D) cross-section images are prepared. Then, adjustment of positions and sizes of such 2D sectional images is performed. Next, unit graphic formation is performed from the sectional images. Next, the scale of unit graphic is determined. Next, labeling processing for partitioning the unit graphic on a per-element basis is performed. Next, an appropriate element name is assigned to each geometry region partitioned. Next, 3D conversion is performed to thereby perform volume graphic composition for preparation of a volume graphic. Next, retouching processing for element selection is applied to a region with its element being failed to be uniquely determined, thereby completing a 3D structure graphics image or "diagram." Lastly, the 3D structure diagram is converted into mesh data. The 3D structure data creation method shown in the flowchart of FIG. 3 will be explained in detail below, while referring to some graphical user interface (GUI) display screens, which will be used as the interface between a user and a computer.

Figure 4:
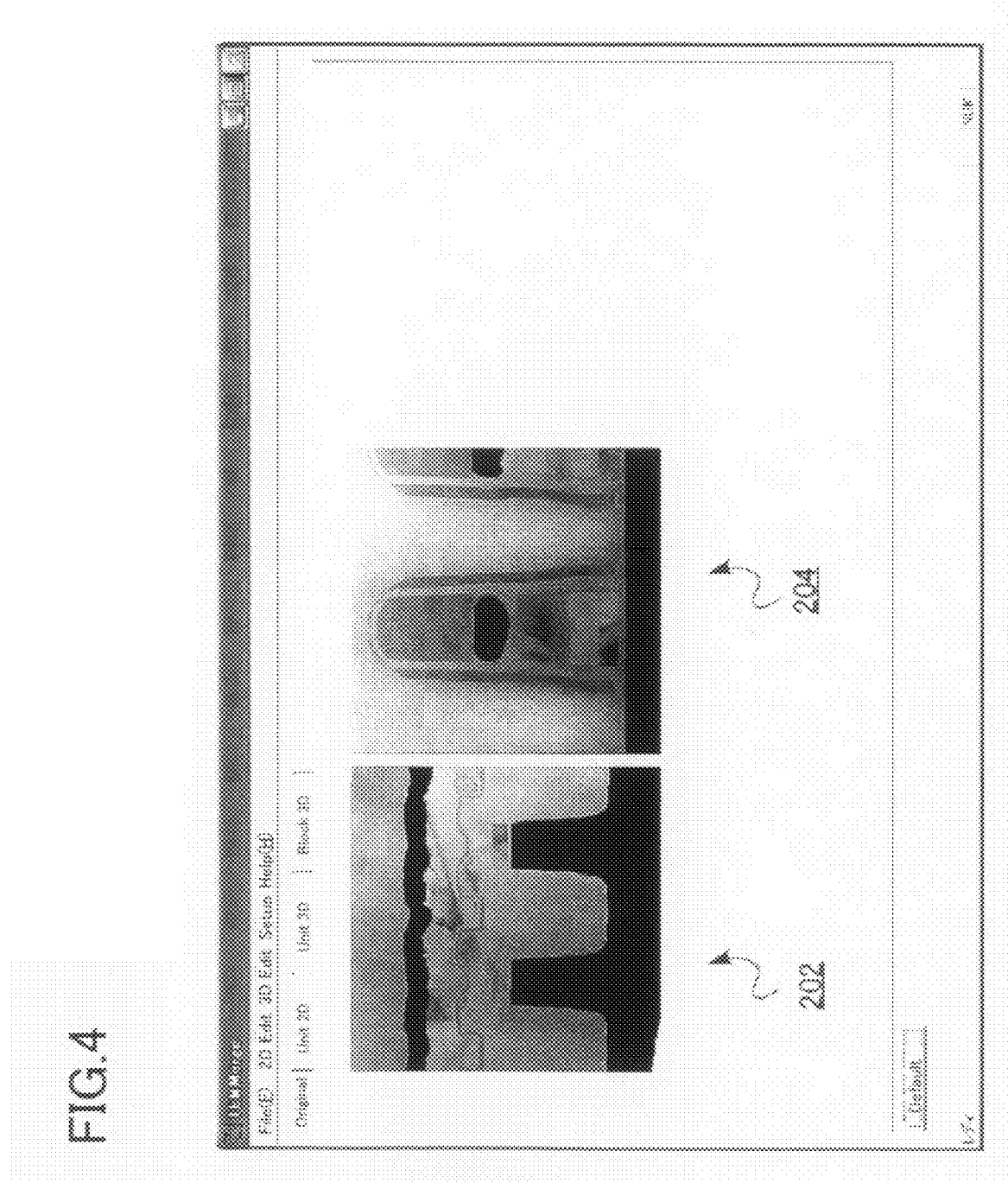
FIG. 4 is a diagram showing a 2D cross-section image adjustment screen of the first embodiment.

FIG. 4 shows a 2D cross-section image adjustment screen. Firstly, an image 204 of a cross-section at right angles to a word line of a memory cell and an image 202 of a cross-section perpendicular to a bit line of the memory cell are prepared as 2D sectional images for creation of 3D structure data. Each of these sectional images is a TEM photograph.

The word-line vertical sectional image 204 and the bit-line vertical sectional image 202 are cross-sections of the memory cell which cross each other at right angles. As shown in FIG. 4, these two TEM photographs are displayed side-by-side on a 2D sectional image adjustment screen or "window." By displaying two 2D sectional images on the same screen in this way, it is possible to facilitate the user to quickly catch the prospect of his or her following works required.

Note here that the TEM photographs being displayed on the 2D sectional image adjustment screen are not always identical in scale to each other. In view of this, the 2D sectional image adjustment screen is added the function of supporting both the scale adjustment of two TEM photographs 202 and 204 and the position adjustment for such scale adjustment.

Figure 5:
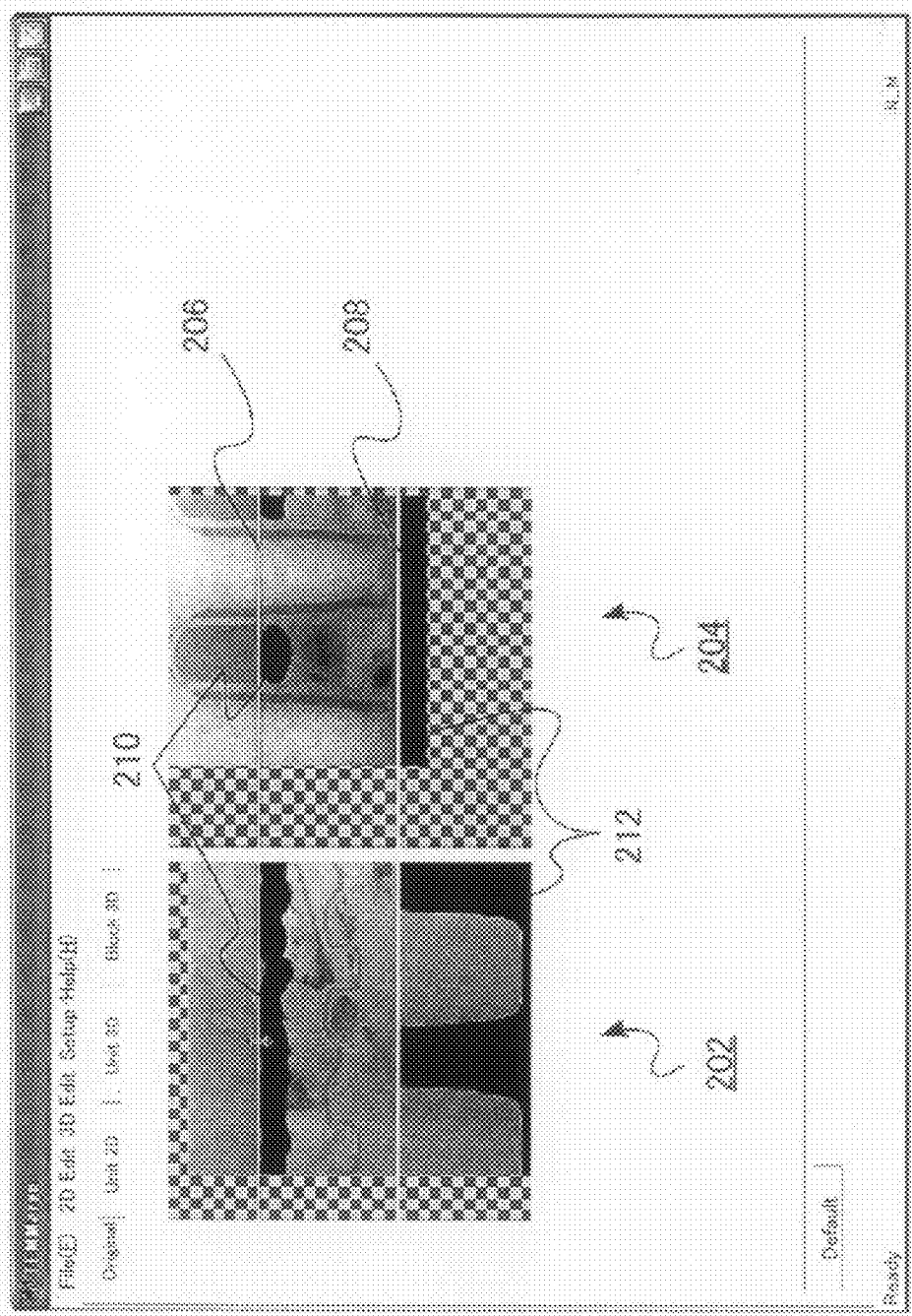
FIG. 5 is a diagram for explanation of functions of scale adjustment and position adjustment on the 2D sectional image adjustment screen of the first embodiment.

FIG. 5 is a diagram for explanation of the scale adjustment and the position adjustment on the 2D sectional image adjustment screen. The scale adjustment and position adjustment are performed in a way which follows: while displaying two parallel line segments on the 2D sectional image adjustment screen, either the first 2D sectional image or the second 2D sectional image is moved in an up-and-down direction, shrunk and/or magnified by the user in such a way that the positions of corresponding portions of the first and second 2D sectional images coincide with one of the two parallel lines while at the same time causing the positions of other corresponding portions of these 2D sectional images to be aligned with the remaining one of the parallel lines.

More specifically, the two upper and lower horizontal lines which are indicated on the TEM photograph of FIG. 5, i.e., first horizontal line 206 and second horizontal line 208, are utilized for position adjustment. These two horizontal lines 206 and 208 extend through the right-hand side sectional image 204 and left-side sectional image 202. The two horizontal lines 206 and 208 are such that each is movable on the two TEM photographs 202 and 204 in a cooperative manner with the other. Here, when the need arises, it is also possible to apply color separation to the two horizontal lines 206 and 208 to thereby improve the on-screen visual recognizability or viewability.

In order to match the scales of two TEM photographs 202 and 204, what is done first is, for example, to force the first horizontal line 206 to align with an upper side of a metal wiring line 210 overlying a word line as shown in FIG. 5. At this time, the first horizontal line 206 is moved so that it aligns with the upper side of the metal wire 210 of the word-line vertical sectional image 204. Thereafter, the second horizontal line 208 is moved so that it aligns with an upper surface of a silicon substrate 212, for example.

Next, the bit-line vertical sectional image 202 per se is moved upward or downward, thereby causing the first horizontal line 206 to become identical with upper part of the metal wire 210. Then, while letting the first horizontal line 206 be kept identical with the upper part of the metal wire 210, the image size of the bitline vertical sectional image 202 is reduced or enlarged in size to ensure that the upper surface of the silicon substrate 212 aligns with the second horizontal line 208. In this way, the two TEM photographs 202 and 204 become equal in scale to each other.

Figure 6:
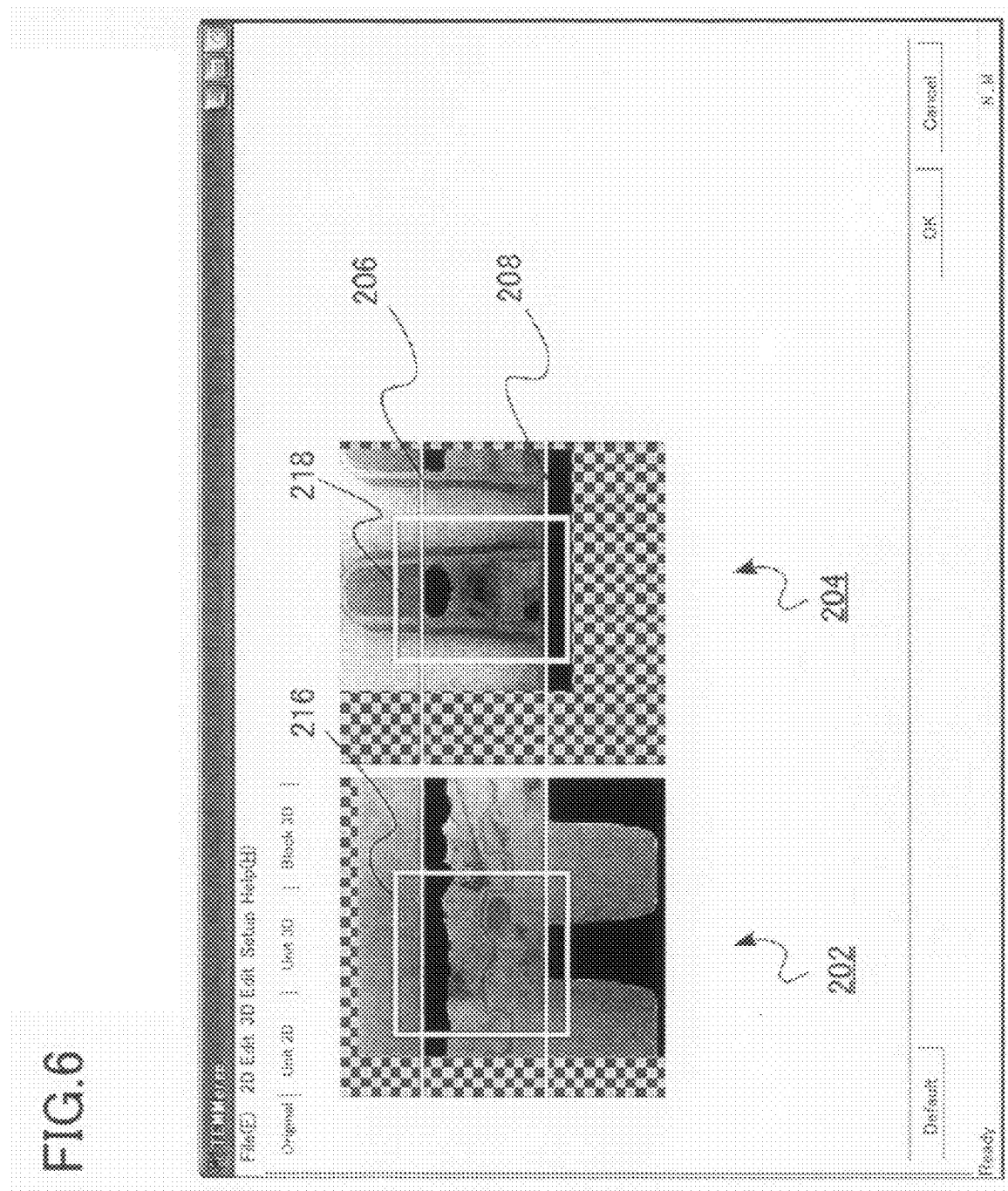
FIG. 6 is a diagram for explanation of a method for forming unit graphics on a unit graphic creation screen of the first embodiment.

Next, two unit graphics are created from the two TEM photographs which were made identical in scale to each other. FIG. 6 is a diagram for explanation of a method for forming such unit graphics on a unit graphic creation screen or window. In the unit graphic creation, first of all, both the first 2D sectional image and the second 2D sectional image prepared are displayed on the unit graphic creation screen at a time. Then, an attempt is made by the user to adjust the sizes of two rectangular regions to his or her desired sizes, which regions are two rectangular areas that are displayed on respective images of the first 2D sectional image and second 2D sectional image, wherein two opposite sides of one rectangular region—here, two edge lines in the horizontal direction—move in a cooperative manner with two opposite sides of the remaining rectangular region, i.e., two edge lines in the horizontal direction. Then, a first unit graphic and a second unit graphic which are for use in the 3D structure data creation are cut out by image extraction techniques.

More precisely, the scale adjustment-completed two TEM photographs 202 and 204 is displayed side-by-side in a similar way to the case of the 2D sectional image adjustment screen. Then, the first rectangular region 218 and second rectangular region 216 are displayed on the wordline vertical sectional image 204 and bitline vertical sectional image 202, respectively. Here, changing the size of first rectangular region 216 results in the size of the second rectangular region 218 being changed dynamically in such a way that a distance between two sides in the horizontal direction becomes the same as that of the first rectangular region 216 whereas upper and lower positions of these two sides in the horizontal direction are the same as those of the first rectangular region 216. On the contrary, the positions of two sides in the vertical direction are changeable independently.

In this way, the sizes of two rectangular regions 216 and 218 are adjusted so that each falls within a range which is considered by the user to be appropriate for the creation of 3D structure data. Then, image segments contained in the two rectangular regions 216 and 218 are cut away or extracted as two unit graphics, respectively.

Figure 7:
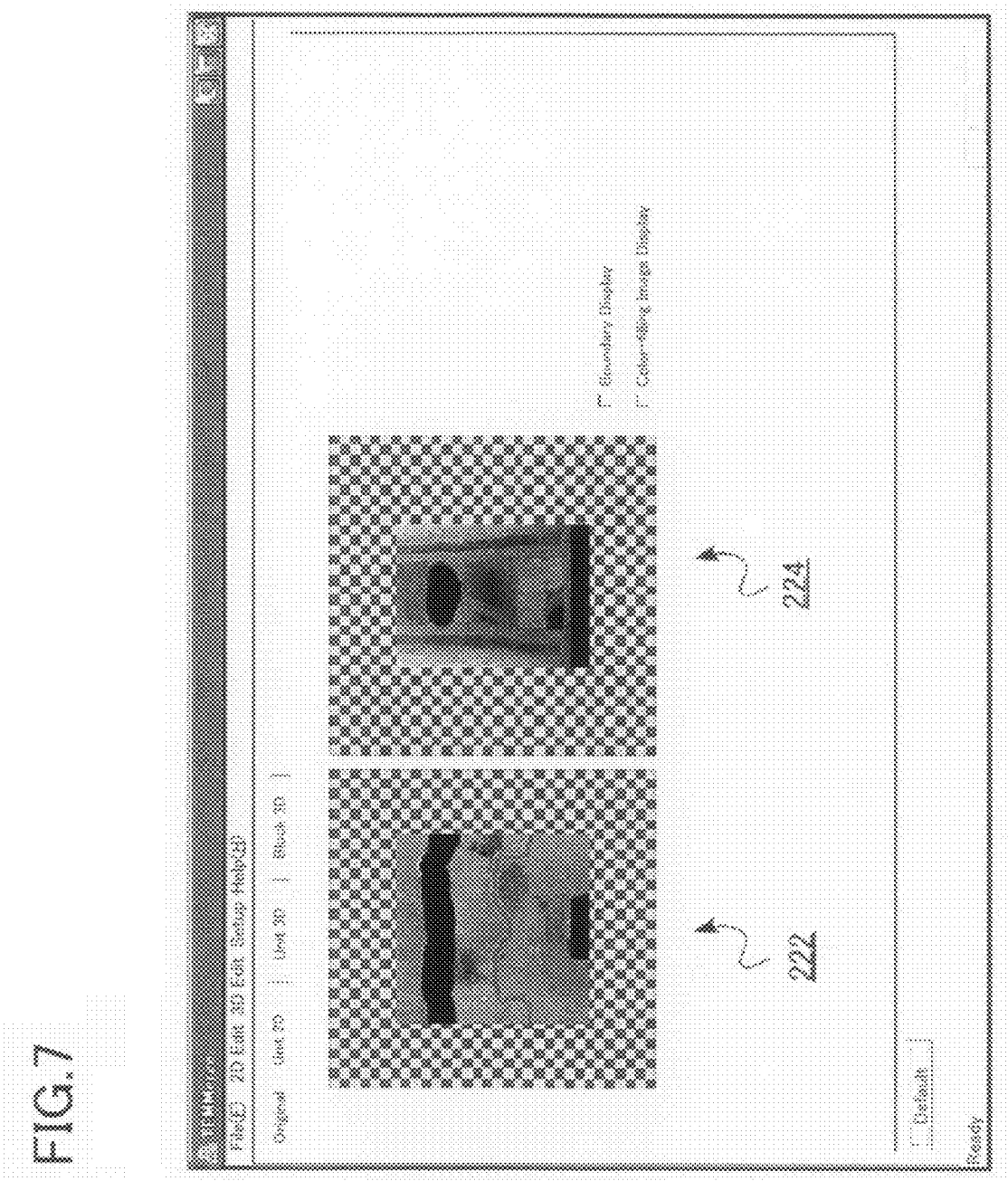
FIG. 7 is a diagram showing a GUI screen that displays an extracted unit graphic(s) of the first embodiment.

The above-stated work is also an operation for trim-off of unnecessary portions in the device simulation. FIG. 7 shows a GUI screen which displays the unit graphics 222 and 224 that was prepared in this way. As apparent from FIG. 7, the unit graphics extracted are formed so that these are the same as each other in the distance between two sides in the horizontal direction and in the upper and lower positions thereof.

Figure 8:
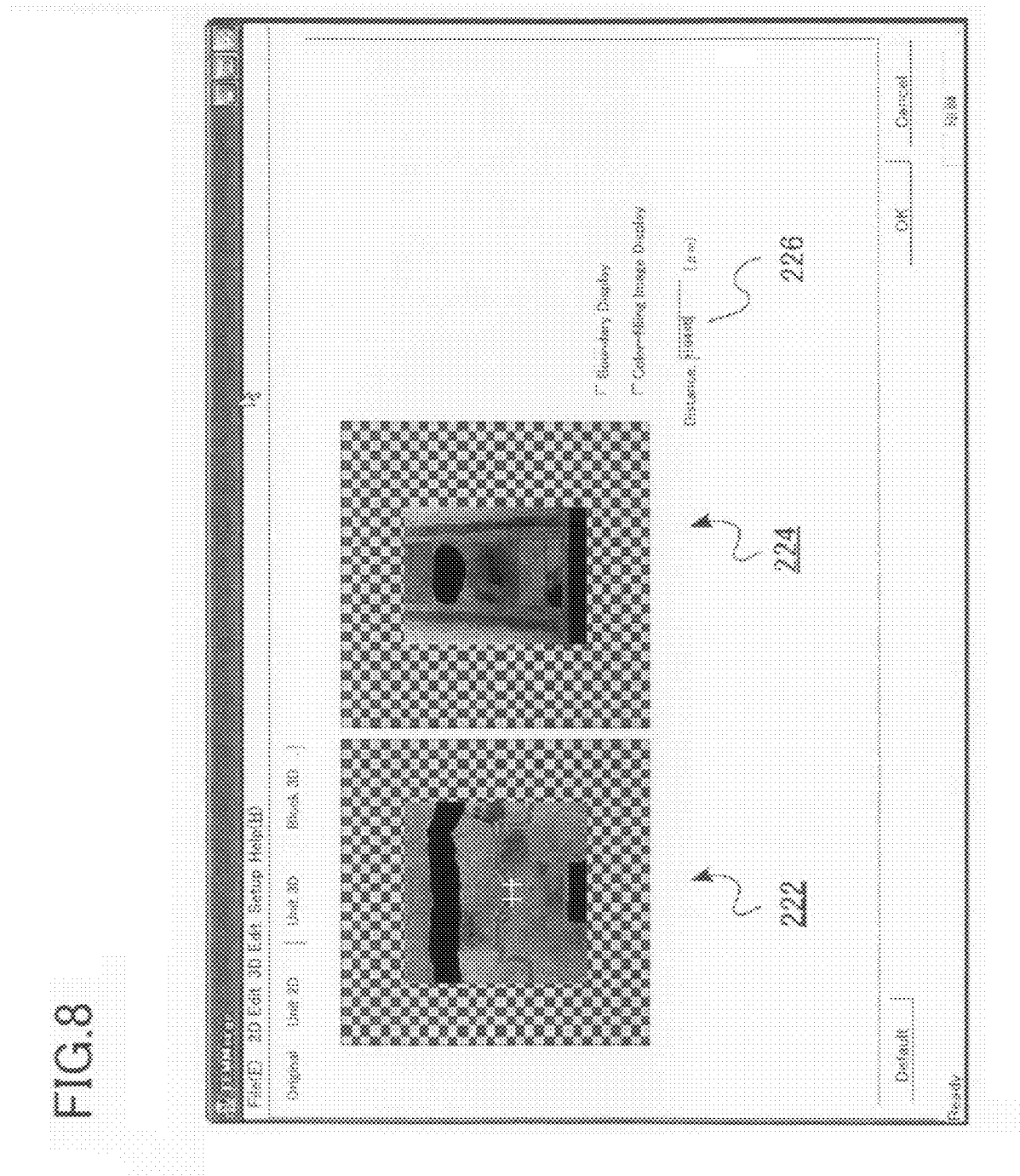
FIG. 8 is a diagram for explanation of a method for determining a contraction scale of unit graphic on a scale determination screen of the first embodiment.

Next, the scale of the unit graphics thus formed is determined on a scale determination screen. FIG. 8 is a diagram for explanation of a method of determining the unit-graphic scale on the scale determination screen. The processing for this scale determination starts with a step which displays either the first unit graphic or the second unit graphic on the scale determination screen. Then, the user designates two separate points either on the first unit graphic or on the second unit graphic. Thereafter, the user sets up a distance between the two points whereby the scale is determined. This processing is a process which becomes necessary in the case of creating 3D structure data for use in device simulation as in this embodiment.

For instance, as shown in FIG. 8, two cross-joint cursors are typically used by the user to designate two points on the first unit graphic 222. Then, a keyboard is manually operated by the user to input the distance between the two points in a distance value input box 226. In FIG. 8, there is shown one exemplary case where the distance between two points is set to 0.0445 µm (44.5 nm).

It should be noted that the positions of the two points to be designated are not the ones that particularly limit the invention. However, it is desirable that the value of a transistor gate length which is readily specifiable in size is used as the index or indicator of the scale. To do this, unlike the example of FIG. 8, it is desirable to designate two points at the opposite ends of a gate of memory cell transistor.

It is also possible to input the value of a distance which is different from that in the case of a actual flash memory cell, from which TEM photographs have been taken. This technique is useful in, for example, a case where there is a demand for performing the simulation with respect to a memory cell having its size which is different from the actual one.

Figure 9:
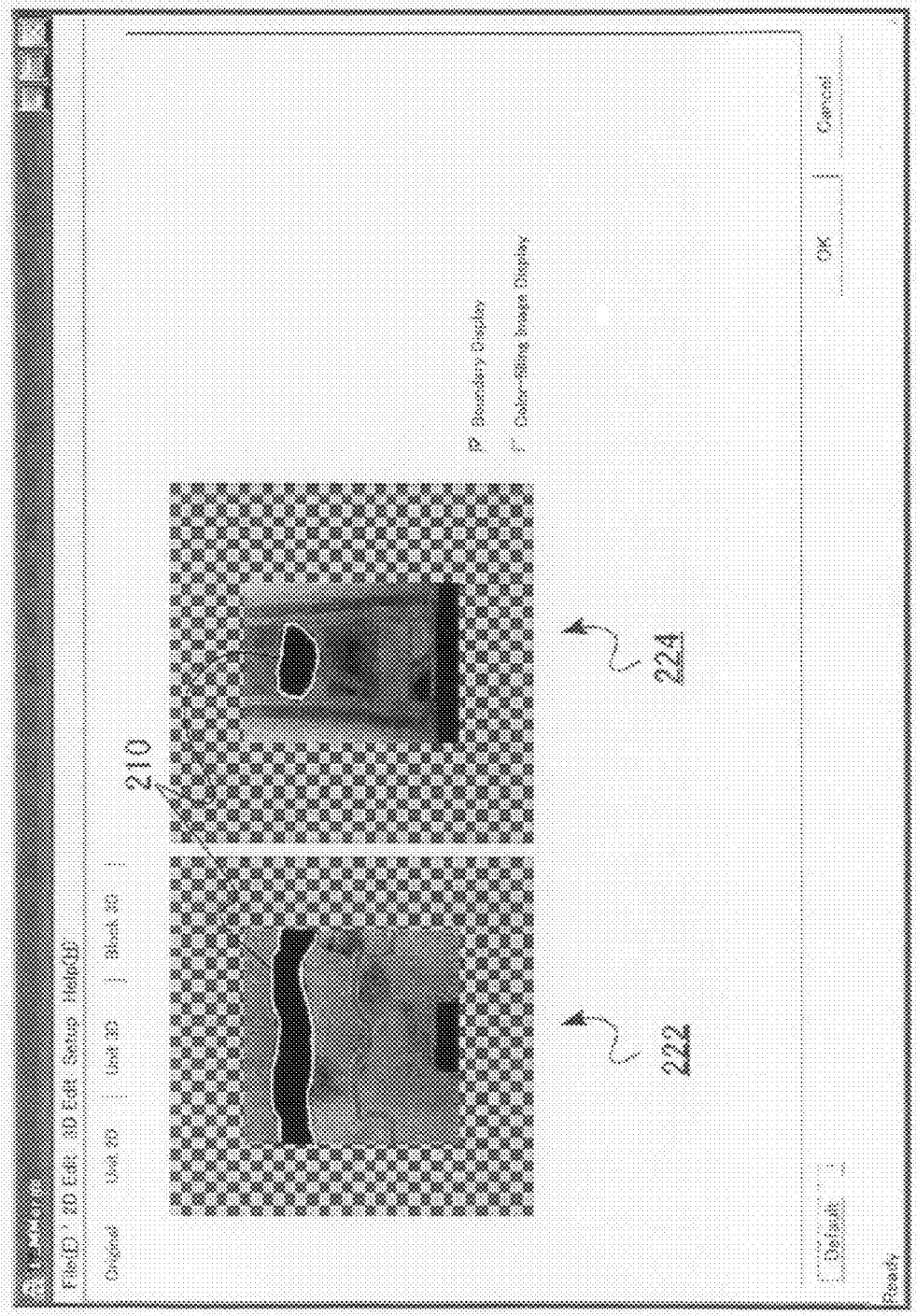
FIGS. 9 to 11 are diagrams for explanation of a method for performing the partitioning of a unit graphic on a labeling processing screen of the first embodiment.
Figure 10:
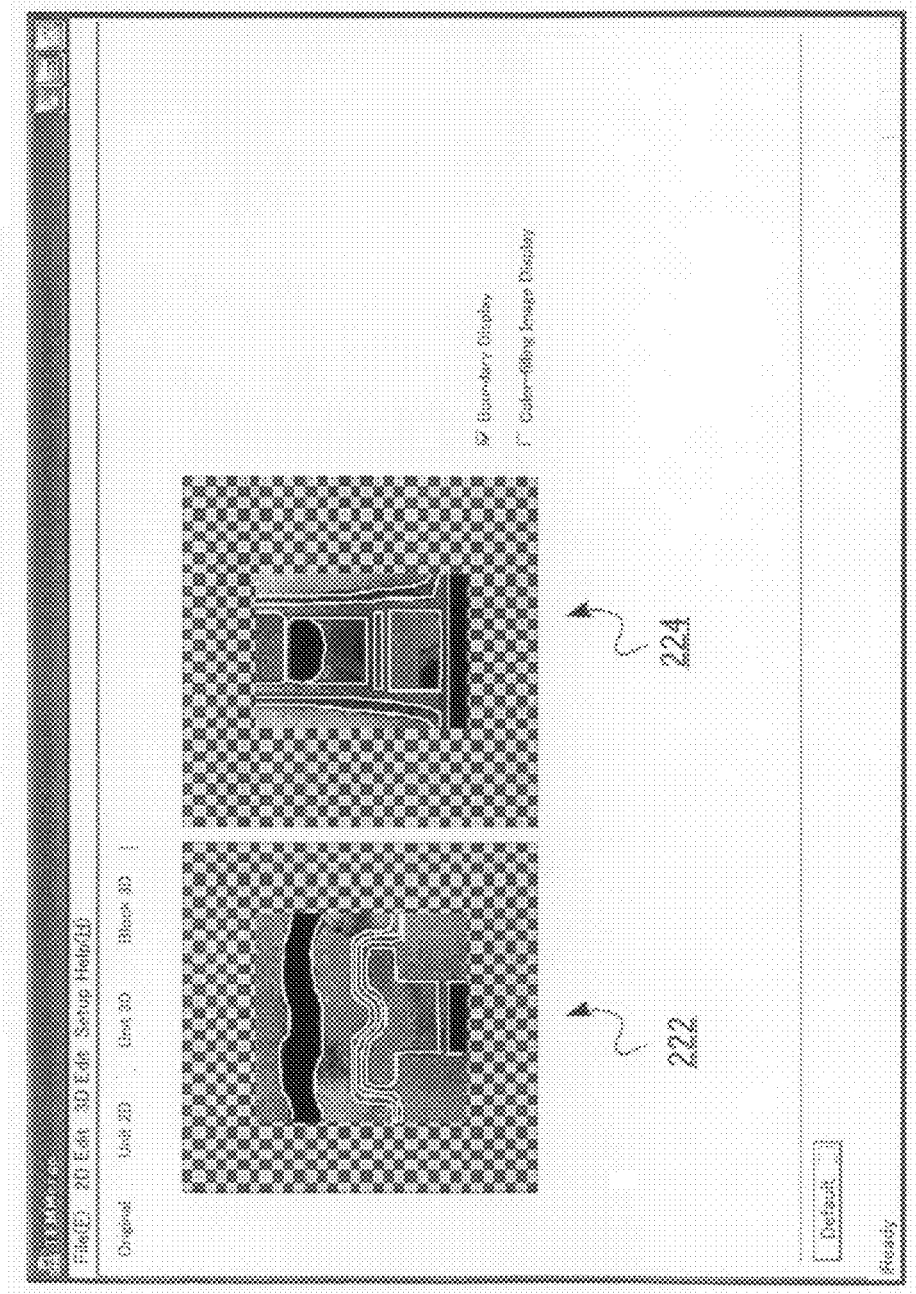
Figure 11:
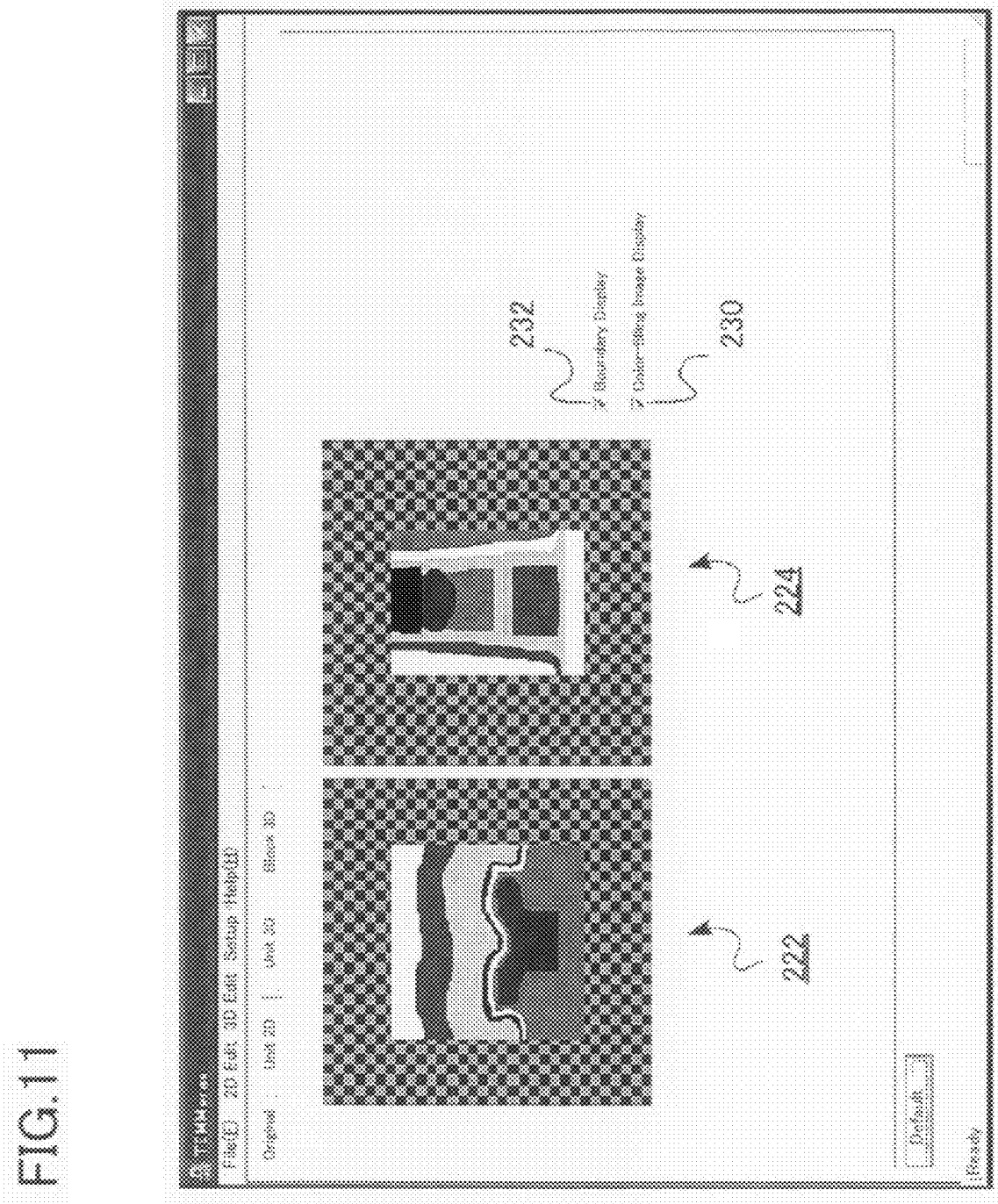

Next, image dividing or "region partitioning" of the unit graphics is performed on a labeling processing screen. FIGS. 9, 10 and 11 are diagrams for explanation of a method of performing such unit graphic partitioning on the labeling processing screen.

The labeling processing starts with a step which displays either the first unit graphic or the second unit graphic on the labeling processing screen. Then, the user draws a boundary line segment on the first unit graphic or the second unit graphic to thereby perform bordering so that the partitioning is done. Then, a region which was partitioned by the boundary line is recognized as a continuous area.

More specifically, as shown in FIG. 9, a boundary line is drawn with respect to the metal wire 210 that overlies the word line by way of example. This boundary line is drawable by moving a pointer in a freehand manner through manual operation of, for example, either a mouse or a tablet pen.

By free-handwriting of the boundary line into the unit graphic in this way, this graphic is partitioned into portions in units of different elements. FIG. 10 is a window-like screen which displays the state that the partitioning was fully completed. With mere execution of such partitioning in this way, a certain degree of 3D structure becomes viewable to the user's eyes.

Then, let the individual boundary-partitioned region be recognized as a continuous area. In other words, data processing is performed under the assumption that an inside part of one partitioned region is entirely constituted from the same element. Based on the data created by this data processing, it is also possible to coat each region with separate color or to apply painting with visual distinction by shading or to perform label pasting by use of a numeral, a mark or an alphabet on a per-region basis.

FIG. 11 shows a window screen which displays respective continuous area-recognized regions while letting each region be painted with different color. On the labeling processing screen, such the image is displayable by entering a check into a color-filling image display check box 230. Alternatively, the check in the color-filling image display check box 230 is removed while alternatively entering a check only at a boundary line check box 232, thus making it possible to display the image shown in FIG. 10. By removing the checks at both the color-filling image display check box 230 and the boundary check box 232, it is possible to display a unit graphic prior to execution of the labeling processing, which does not contain therein any partition information.

Figure 12:
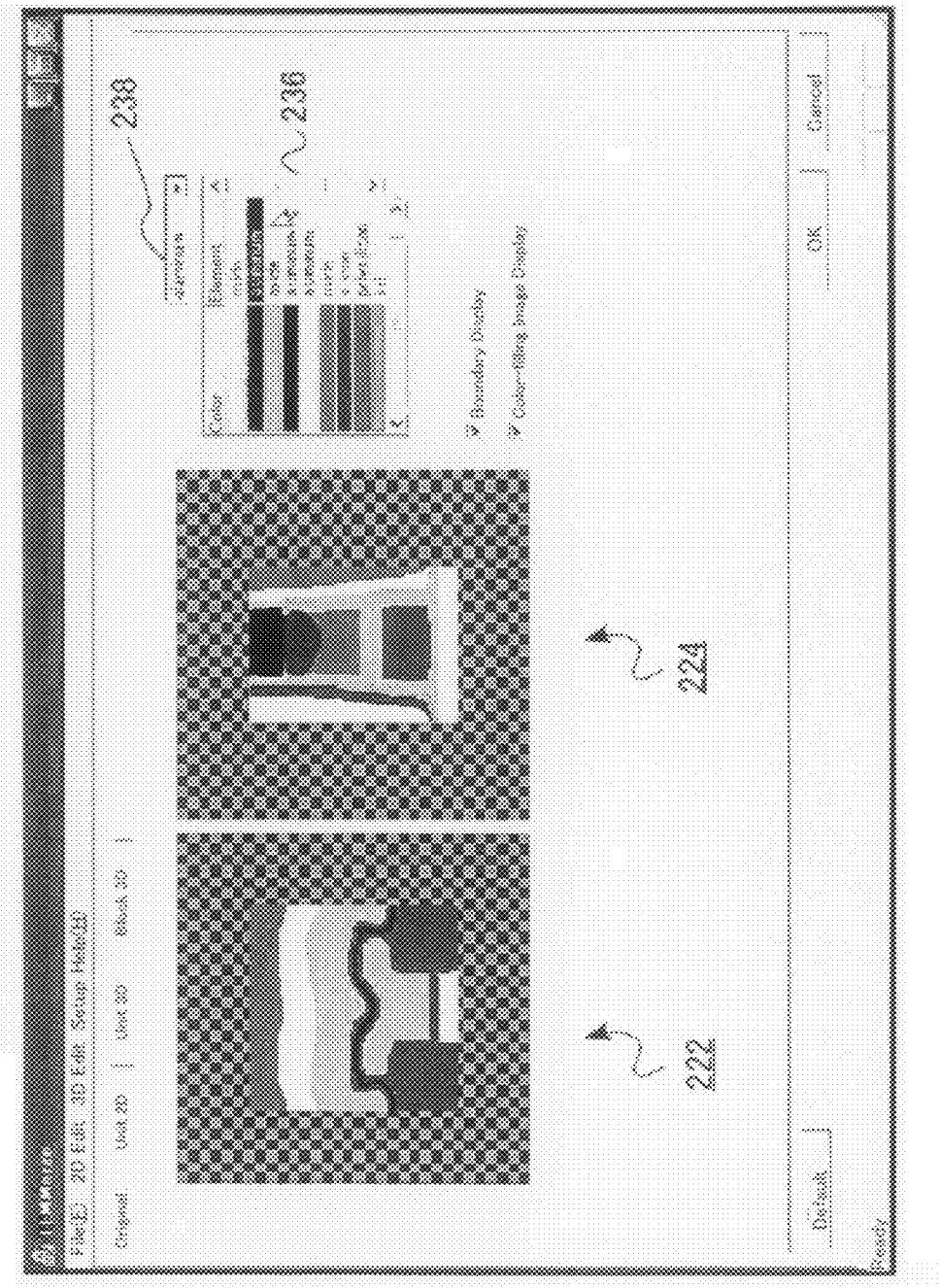
FIG. 12 is a diagram for explanation of a method for performing element allocation on an element allocation screen of the first embodiment.

Next, element allocation is performed on an element allocation window screen. FIG. 12 is a diagram for explanation of a method for performing the element allocation on the element allocation screen.

The element allocation is executed in a way which follows: while displaying on the element allocation screen either the first unit graphic or the second unit graphic which has been partitioned on the labeling processing screen, the user allocates his or her desired elements, in this case materials, to the partitioned regions respectively.

More specifically, when clicking on each region which was partitioned by the labeling processing, a corresponding row in an area list screen 236 is reversed in color. Then, the user selects from a "combo" box 238 an element that she or he wants to allocate to the reversed region. It is also possible to add new element names to the combo box 238.

Next, a volume graphic is composed by image synthesis. The volume graphic is obtainable by combining together data which was 3D-converted by extending the first unit graphic that was partitioned by the labeling processing in the normal line direction of the first sectional image and data which was similarly 3D-converted by extending the second unit graphic that was partitioned by the labeling processing in the normal line direction of the second sectional image.

Figure 13:
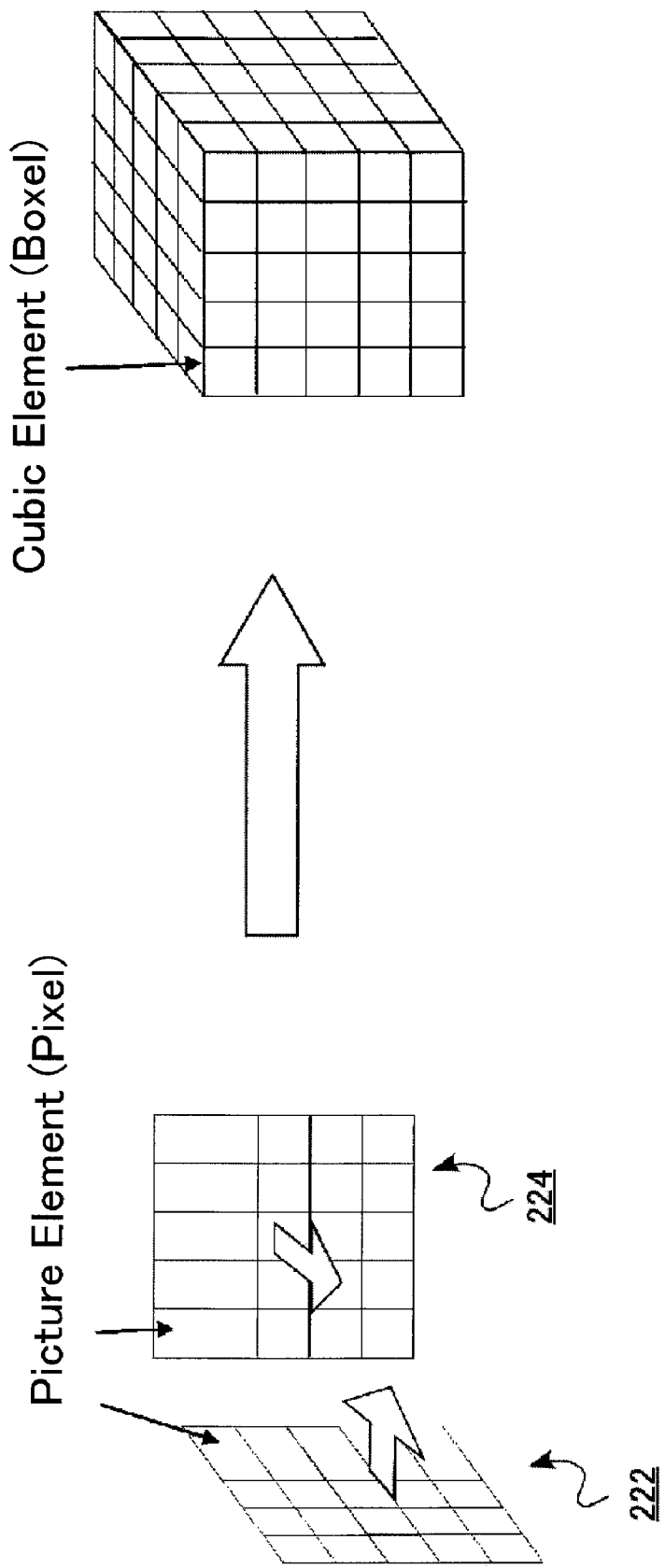
FIG. 13 is a diagram for explanation of a method for forming a 3D volume graphic through composition of two unit graphics in the first embodiment.

FIG. 13 is a diagram for explanation of a method for forming a 3D volume graphic by image composition of two unit graphics. The first unit graphic 222 and the second unit graphic 224, each of which was partitioned into a plurality of picture elements or "pixels," are laid out in accordance with respective normal vectors. In other words, each graphic is put at a location which is deemed similar to the inherent 3D position of the cross-section image that became the base of the first and second units. In a case where these are the images of cross-sections intersecting each other at right angles as in this embodiment, respective unit graphics are placed so that these cross each other perpendicularly. Then, stretching is performed in a direction in parallel with the other unit graphic—here, the normal line directions of respective unit graphics as indicated by arrows—to thereby perform 3D conversion. A cubic body which is formed by intersection of stretched pixels of two unit graphics 222 and 224 is called the cubic element or "boxel." The resulting 3D volume graphic is to be constituted in the form of an ensemble of such boxels.

Figure 14:
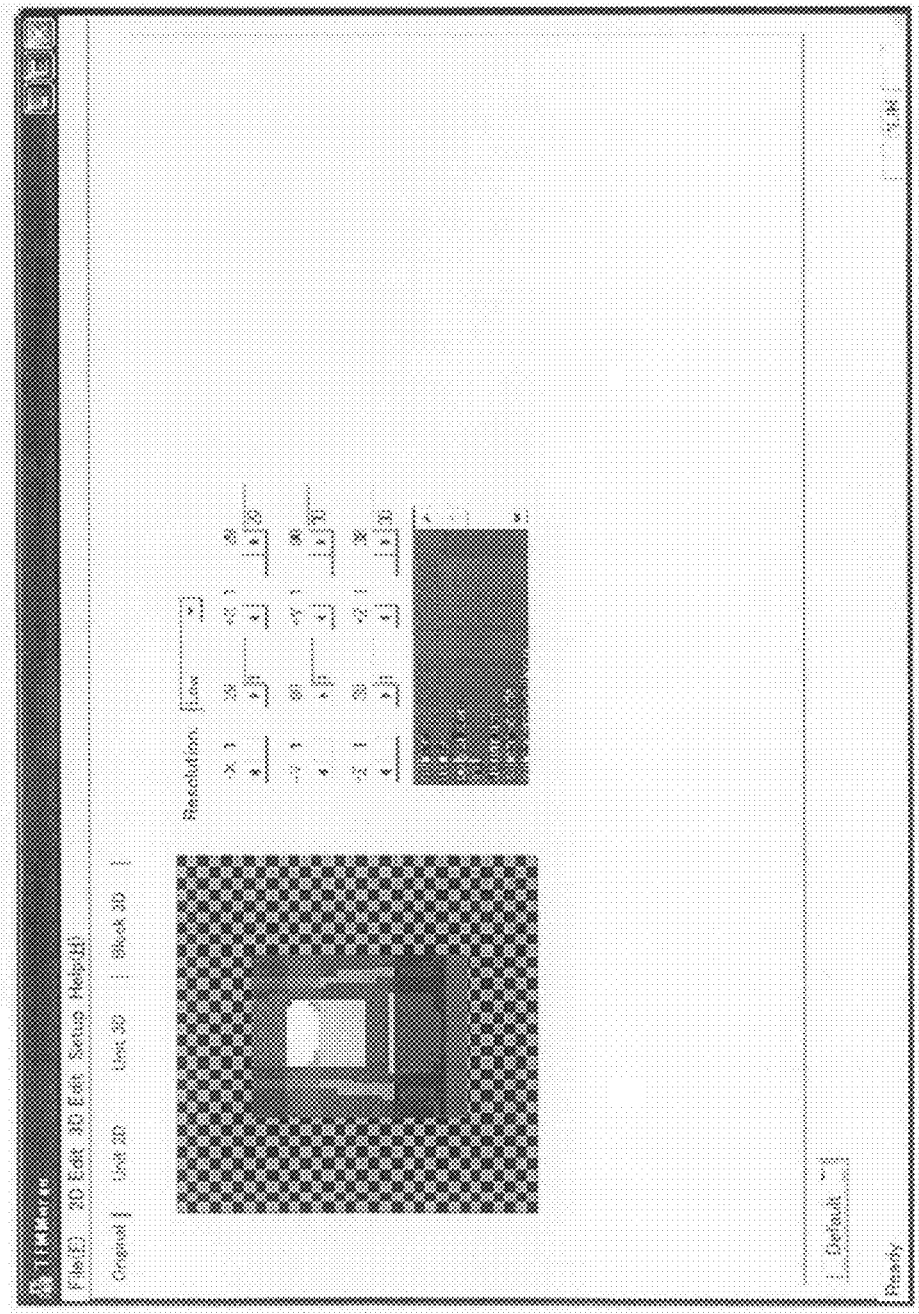
FIG. 14 is a diagram showing a volume graphic display screen which displays a volume graphic which was composed from two pieces of labeling-processed unit graphics in the first embodiment.

FIG. 14 shows a volume graphic display window screen for displaying the volume graphic that was composed from the above-noted two pieces of labeling-applied unit graphics. There is shown herein a volume graphic when looking at from the direction perpendicular to word lines of NAND flash memory.

On this volume graphic display screen, it is possible for the user to rotate, move in parallel, expand or shrink the volume graphic. Alternatively, this volume graphic is modifiable in degree of image resolution. It is also possible to display a 2D cross-sectional image at any given position of the volume graphic. After having rotated it, cross-section displaying is performed, thereby making it possible to display the image of a cross-section at any given normal line.

Figure 15:
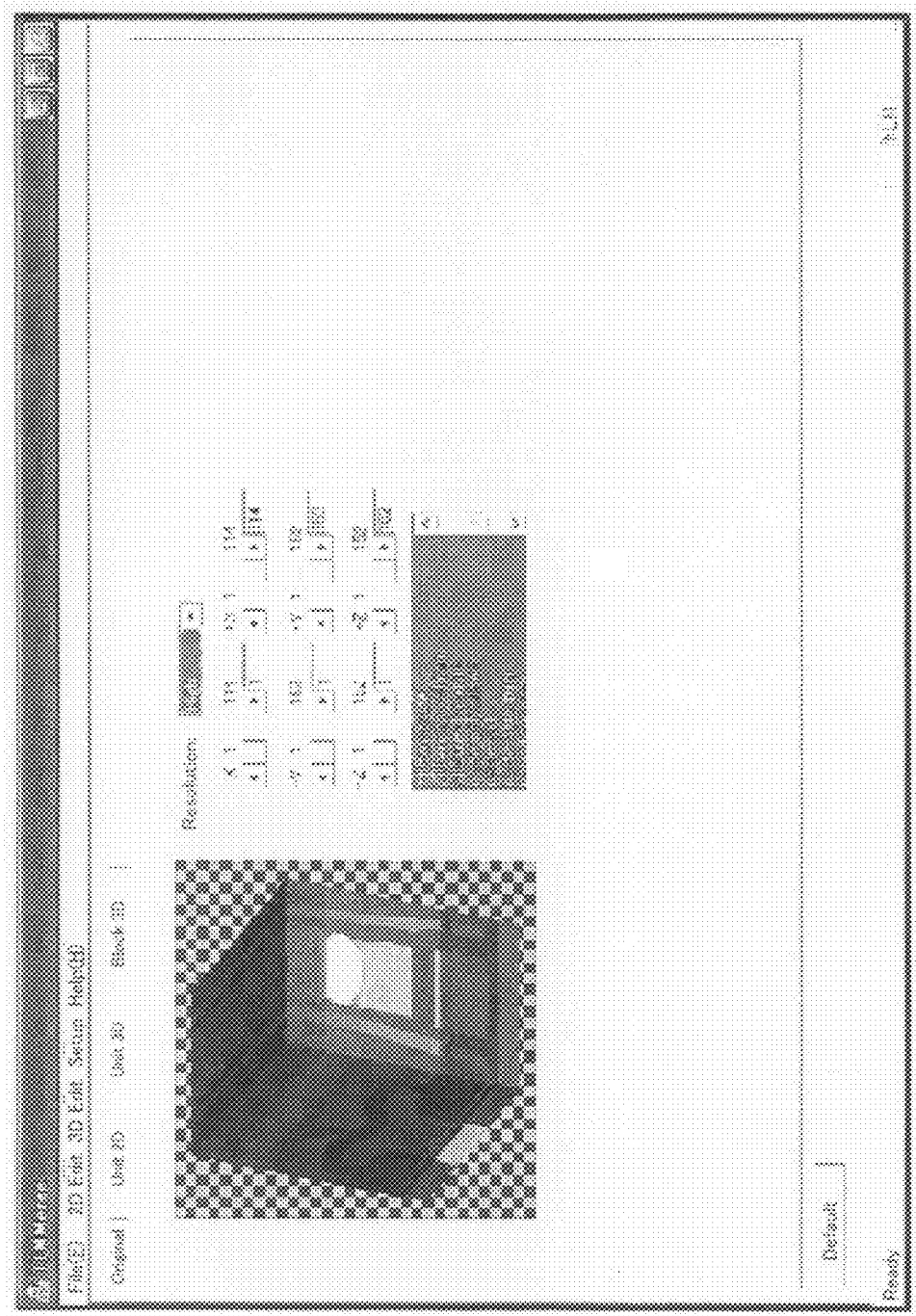
FIG. 15 is a diagram showing the case where the direction is rotated on the volume graphic display screen of the first embodiment.
Figure 16:
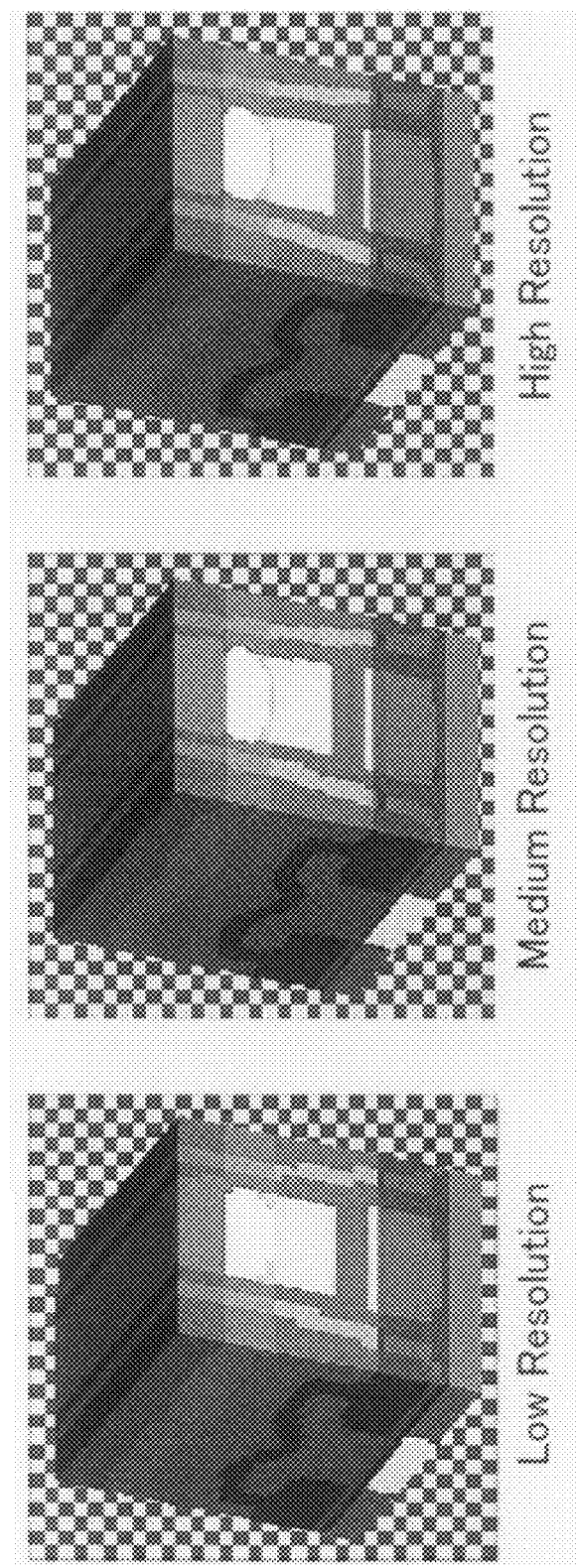
FIG. 16 is a diagram showing the case where the degree of image resolution is changed for display on the volume graphic display screen of the first embodiment.

FIG. 15 shows one exemplary case where the direction is rotated on the volume graphic display screen. FIG. 16 shows another case where the degree of image resolution is changed for display on the volume graphic display screen.

Figure 17:
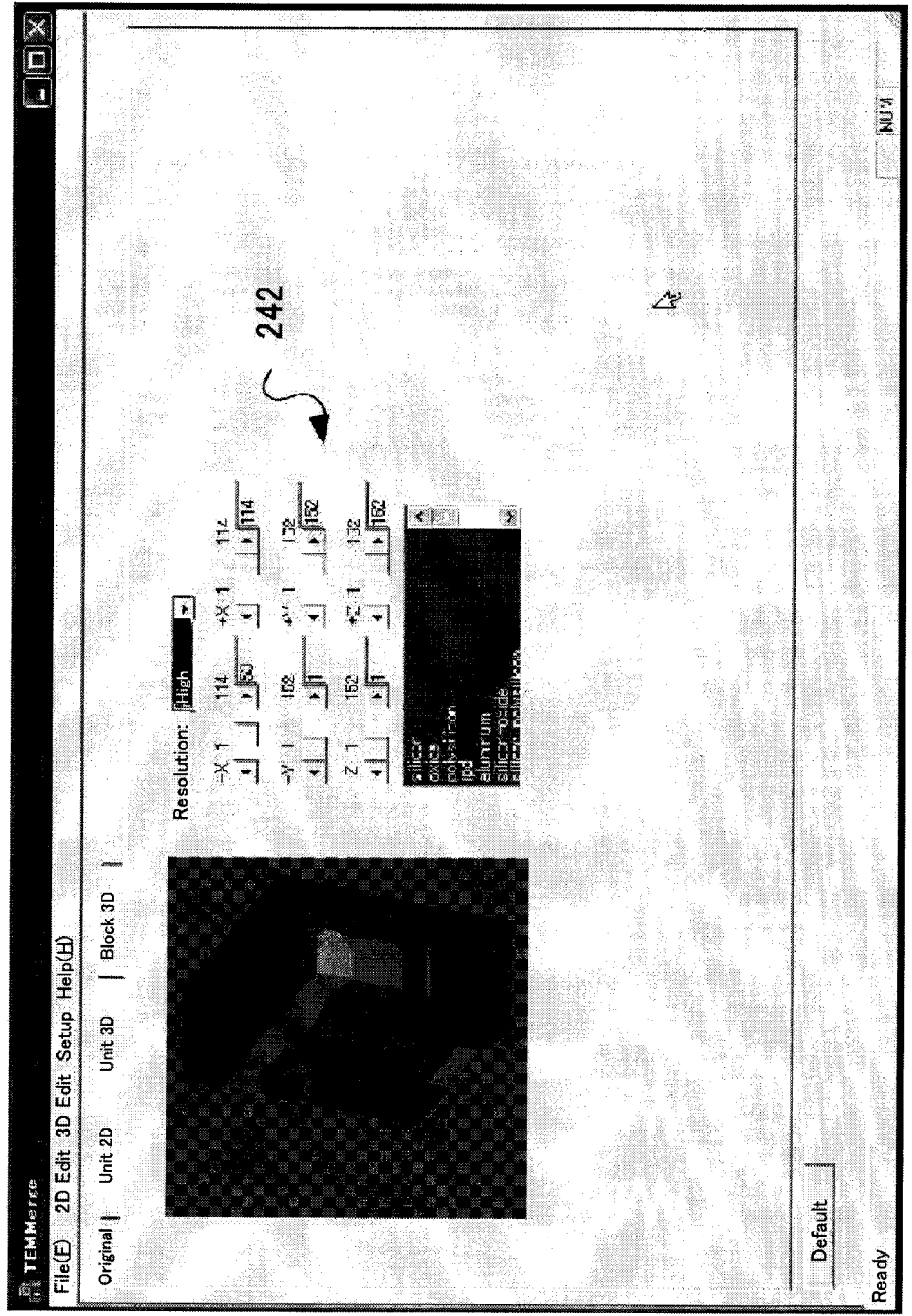
FIG. 17 is a diagram showing the case where a 2D cross-section image at any given position is displayed on the volume graphic display screen of the first embodiment.

Additionally, FIG. 17 shows a case where a 2D sectional diagram at any given position is displayed on the volume graphic screen. Such modification of the position of cross-section being displayed is enabled by designation of a coordinate position in an X-axis, Y-axis or Z-axis direction while causing a coordinate position scroll bar 242 to move appropriately.

Figure 18:
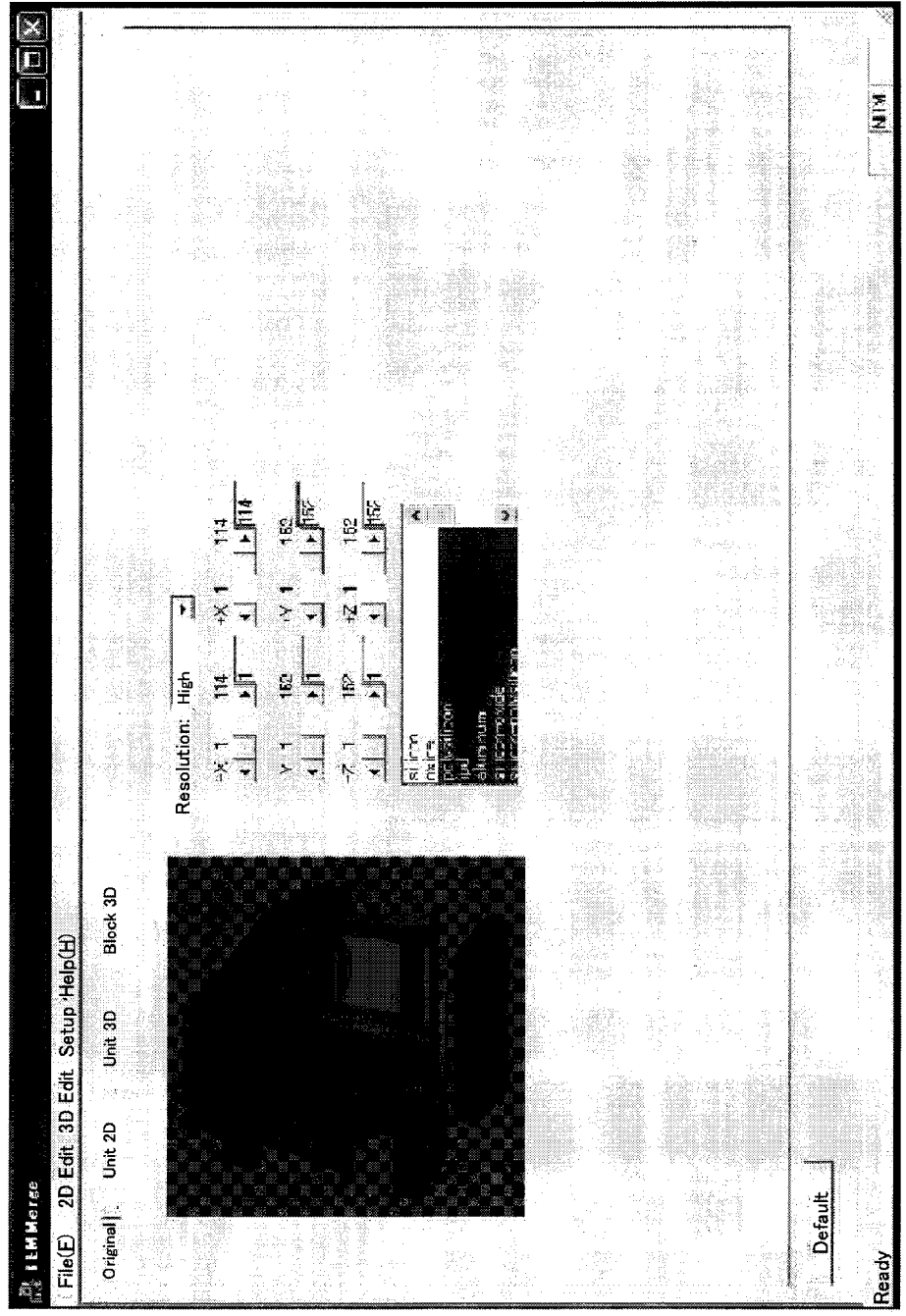
FIG. 18 is a diagram showing an example which displays an element with its selected/non-selected state being changed in the first embodiment.

Note here that on the volume graphic window screen, it is also possible for the user to set either any given region(s) or element(s) of the volume graphic to become invisible, i.e., non-display. FIG. 18 shows an example which displays the elements while changing the selected/non-selected states of some of them. In the case shown herein, a part of the memory cell which is made of silicon and a silicon oxide film are prevented from being displayed on the window screen. With this partial nondisplay setup, it becomes possible for the user to readily grasp the structure of a region that has been buried behind the silicon and the silicon oxide film when compared to the case of every element being displayed. The volume graphic window screen and its function can also be applied for verification of a image of a 3D structure data finally created by applying a retouching processing described below.

Next, retouching processing is applied to the volume graphic thus composed in the way stated above. In the retouching processing, an identical element is allocated to a region in which the element of first unit graphic and the element of second unit graphic are identical to each other, wherein the region is in those regions in which respective partitioned portions of the 3D-converted first unit graphic and respective partitioned portions of the 3D-converted second unit graphic cross together. Alternatively, either one of the element of first unit graphic and the element of second unit graphic is selected and allocated to a region in which the element of first unit graphic and the element of second unit graphic are not identical to each other in the regions in which respective partitioned portions of the 3D-converted first unit graphic and respective partitioned portions of the 3D-converted second unit graphic intersect together. A practically reduced procedure thereof will be described later.

The method of forming a 3D volume graphic by composing together two separate unit graphics has been described previously with reference to FIG. 13. The volume graphic is formed by extending the orthogonally intersecting TEM cross-section photographs, which are the two unit graphics, in the normal line directions thereof. Due to this image processing, there remains a region with two different elements being allocated thereto. In the example shown in FIG. 13, a boxel is found in the boxels generated, to which boxel two different elements are allocated due to the fact that two corresponding pixels belong to different element regions. Apparently, without instructions for specifying which one of the elements is to be allocated to such region with two different elements being allocated thereto, it is impossible to produce the intended 3D structure which is suitable for practical applications.

Figure 19:
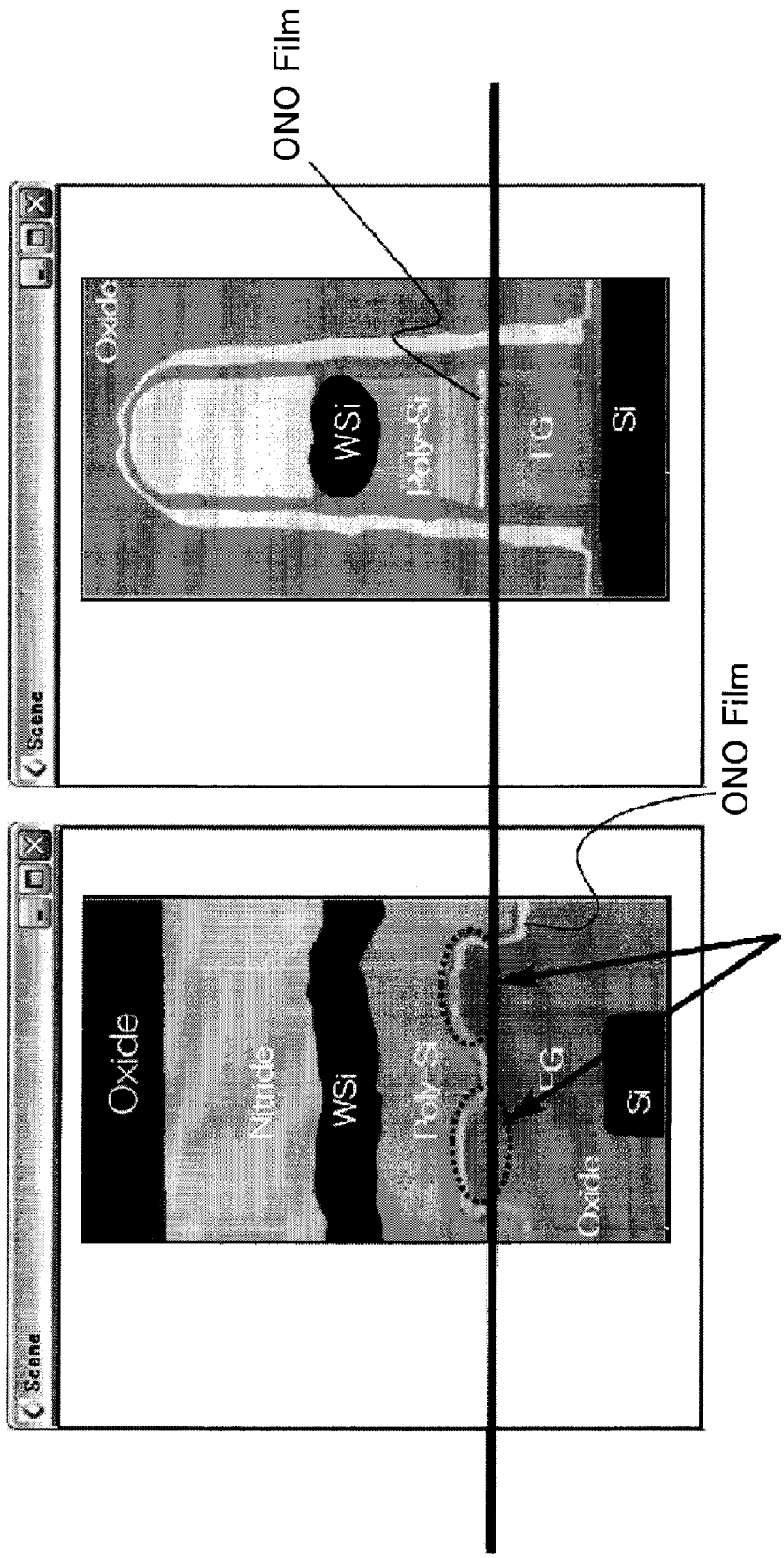
FIGS. 19 and 20A-20B are diagrams for explanation of retouching processing of the first embodiment.

FIG. 19 is a diagram for explanation of the retouching processing. Now consider the case where two right and left unit graphics shown herein are graphically combined together to provide a volume graphic. Here, attention is paid to an oxide nitride oxide (ONO) film, which is present in image areas that are encompassed by dot-line loops in the left-hand side unit graphic of FIG. 19. In the event of the volume composition, this ONO film image is graphically stretched in a direction at right angles to the left-side unit graphic (i.e., normal-line direction). In contrast, if the right-side unit graphic, which is the image of a cross-section which crosses the left diagram perpendicularly, a region would be formed in the volume graphic, to which region both the ONO film of the left-side diagram and a polysilicon of the right-side diagram are allocated together. In this region, if an element of the polysilicon is allocated, the ONO film which should have actually existed is removed away unintentionally, resulting in unwanted lack of the ONO film.

Figure 20B:
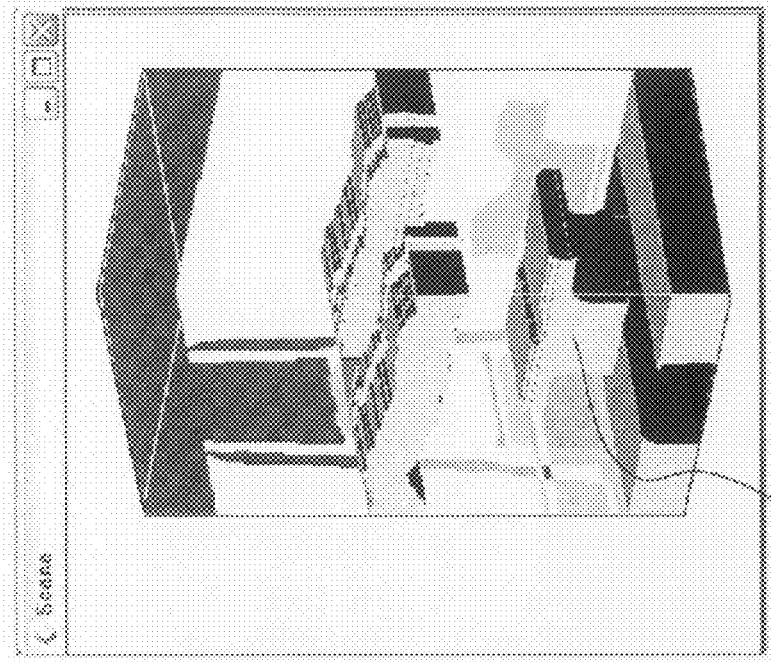
Figure 20A:
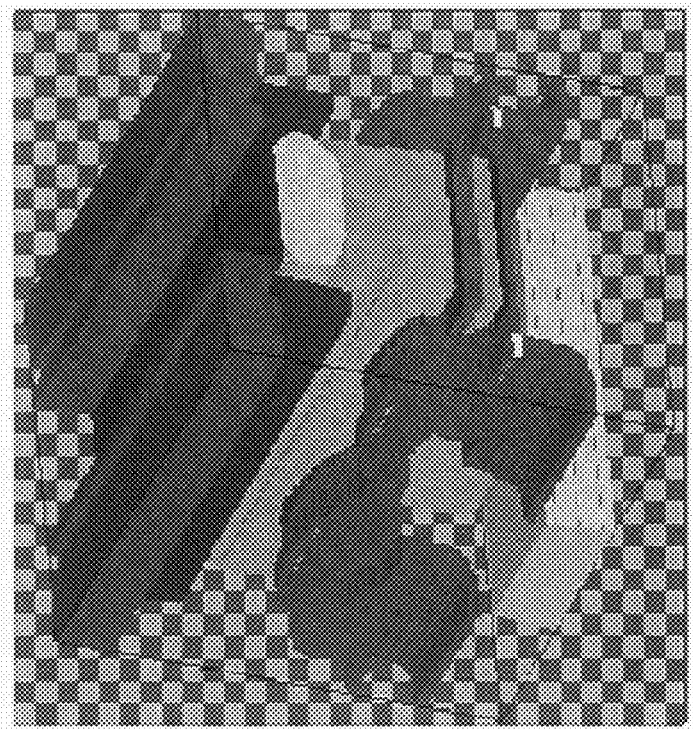

FIGS. 20A and 20B are for explanation of an effect of the retouching processing. FIG. 20A shows the volume graphic which was composed from the unit graphics of FIG. 19 with retouching applied thereto whereas FIG. 20B shows the same without execution of the retouching processing. Note here that the language "retouching applied" which is indicated in FIG. 20A refers to a case where the polysilicon is selected in the region to which both the ONO film at the portions indicated by the dot lines in FIG. 19 and the polysilicon have been allocated together. The term "no retouching applied" used in FIG. 20B refers to a case where the ONO film is selected in such region.

In the case of FIG. 20B with no retouching applied, the ONO film which must actually exist is disappeared, resulting in a floating gate (FG) with its original shape like the spread wings of a butterfly becoming planar. As apparent from the foregoing discussion, for the region (boxel) with two different elements being allocated thereto, a need is felt to appropriately instruct which one of the elements should be allocated. This processing is called the retouching processing, or simply, retouching. On the contrary, for the region in which the element of first unit graphic and the element of second unit graphic are identical to each other, such the identical element is allocated thereto.

Figure 21:
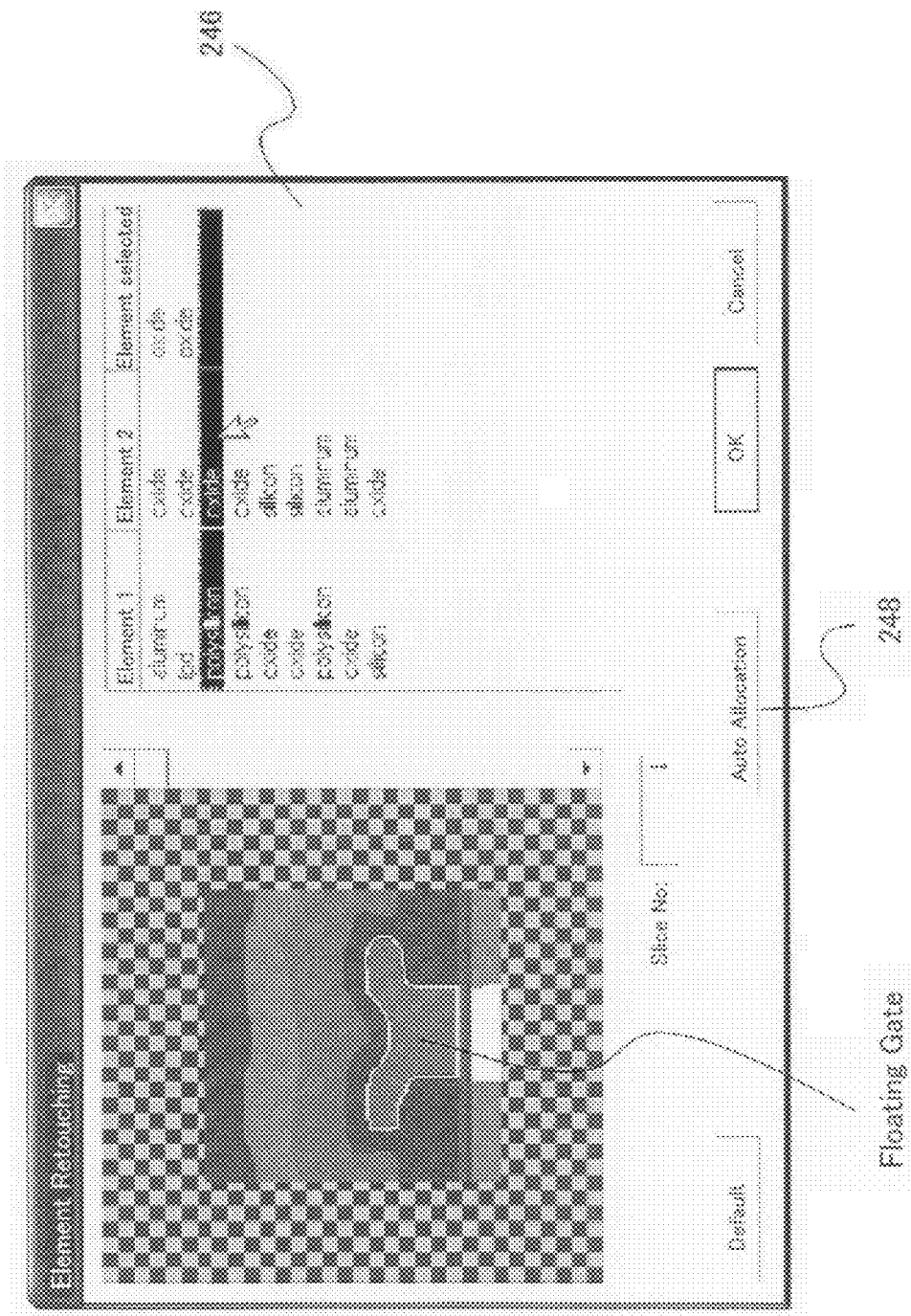
FIG. 21 is an explanation diagram of a retouching processing screen of the first embodiment.

FIG. 21 is a diagram for explanation of a retouching window screen. In an element selection dialog 246, in this case material selection dialog, at the right part of this screen, an element candidate No. 1 (shown as "Element 1" in the figure) and an element candidate No. 2 (shown as "Element 2" in the figure) are displayed, any one of which is selectable by the user. These element candidates are the elements that are allocated to two pixels making up a corresponding boxel. In the list of the element select diagram 246 shown herein, the top and the second top ones are such that "oxide" has already been selected, with the third top one and et seq. being set in a non-select state. Additionally, in the left-hand side unit graphic, a presently selected region—here, floating gate—is displayed with visual emphasis of white bordering applied thereto. This region corresponds to a region at the third top line in the element select dialog 246.

In the retouching processing of this embodiment, the display position of a 2D sectional image which is in parallel with either one of two unit graphics along either one of the coordinate axes of the volume graphic is subjected to parallel displacement at prespecified intervals or pitches, thereby continuously displaying it on the retouching processing screen. Then, the user selects either one of the element of a partitioned portion of the first unit graphic and the element of a partitioned portion of the second unit graphic and then allocates the selected one to a region in which the element of first unit graphic and the element of second unit graphic are not identical to each other in the regions in which respective partitioned portions of the 3D-converted first unit graphic and respective partitioned portions of the 3D-converted second unit graphic cross together.

More specifically, the cross-section of the volume graphic such as shown in FIG. 21 is continuously displayed while at the same time causing it to move by little and little in a parallel shift fashion, for permitting repeated execution of element selection. The coordinate axis at which the cross-sections intersect together may be arbitrarily chosen by the user, such as the X-axis, Y-axis, Z-axis or any separately defined axis. A coordinate axis that allows the user to easily select the element may be selected.

Regarding the spacing between 2D sectional images during the parallel shift, it is desirable that the spacing be equal to or greater than the degree of image resolution (mesh interval) in the direction of the axis at which the cross-sections cross together at right angles. The reason of this is as follows: if the retouching is performed while the spacing is smaller than the mesh interval, the resultant 3D structure data does not increase in amount of information.

Here, in case one of the 2D sectional image being continuously displayed is the same in phase geometry as its immediately previous version of 2D sectional image, it is permissible to cause the system to automatically recognize that each partitioned portion is constituted from the same element of its immediately preceding 2D sectional image. An example is that when the data resolution is increased, the number of 2D sectional images for element selection increases in the retouching processing. This results in an increase in length of a work time necessary for the retouching. In view of this, it is deemed effective to accede the element that was selected on a previous 2D screen as far as the previous 2D cross-section and its following one are the same in geometry as each other and then perform the element allocation in an automated way.

Figure 22:
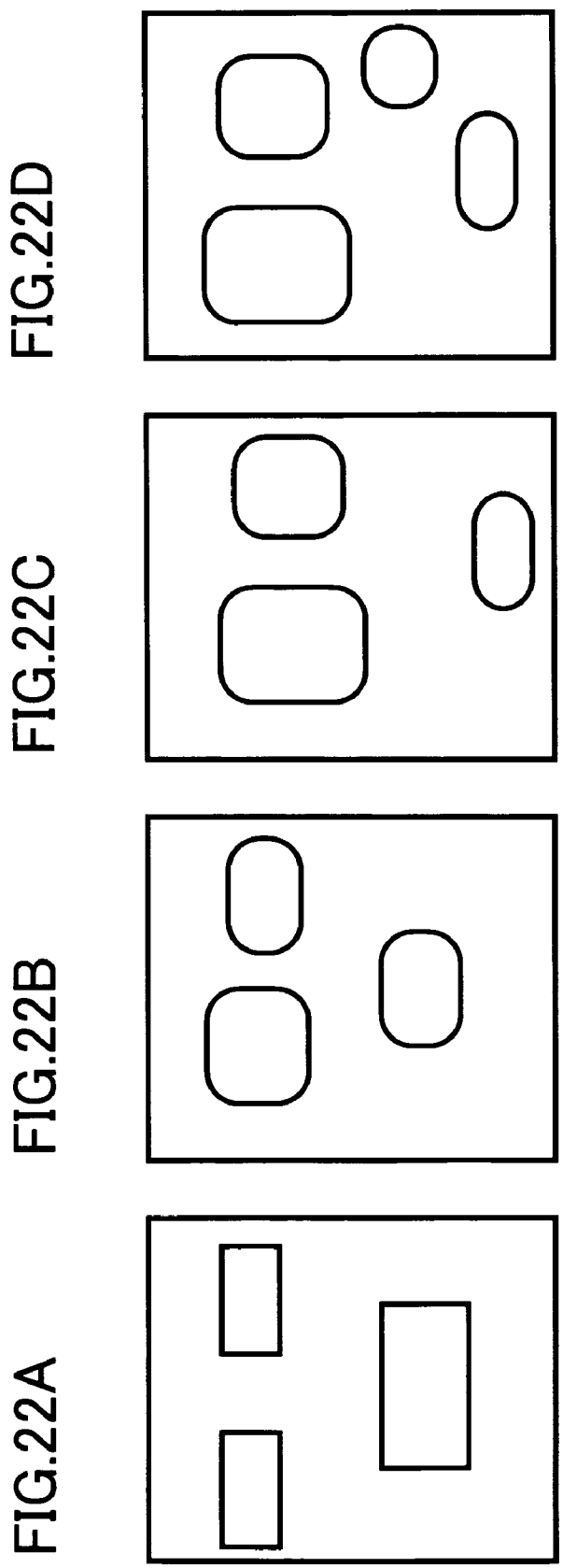
FIGS. 22A to 22D are diagrams for explanation of automatic element allocation processing of the first embodiment.

FIGS. 22A to 22D are for explanation of the automatic element allocation processing. FIGS. 22A-22D show one exemplary sequence of cross-section images to be displayed in this order. Here, the images of FIGS. 22A-22C are decided to be geometrically the same as each other because each of them contains three equivalent closed regions. Accordingly, when the automatic allocation is selected, the same element is allocated to all of corresponding regions in the FIGS. 22A, 22B and 22C.

By contrast, in a 2D cross-section image shown in FIG. 22D, four closed regions are present. Thus, this is regarded to be different in geometry from its previous 2D cross-section image shown in FIG. 22C. Hence, even when the automatic allocation processing has been selected, element allocation is not performed automatically. In this case, the user is expected to select an appropriate element by manual operations.

Figure 23:
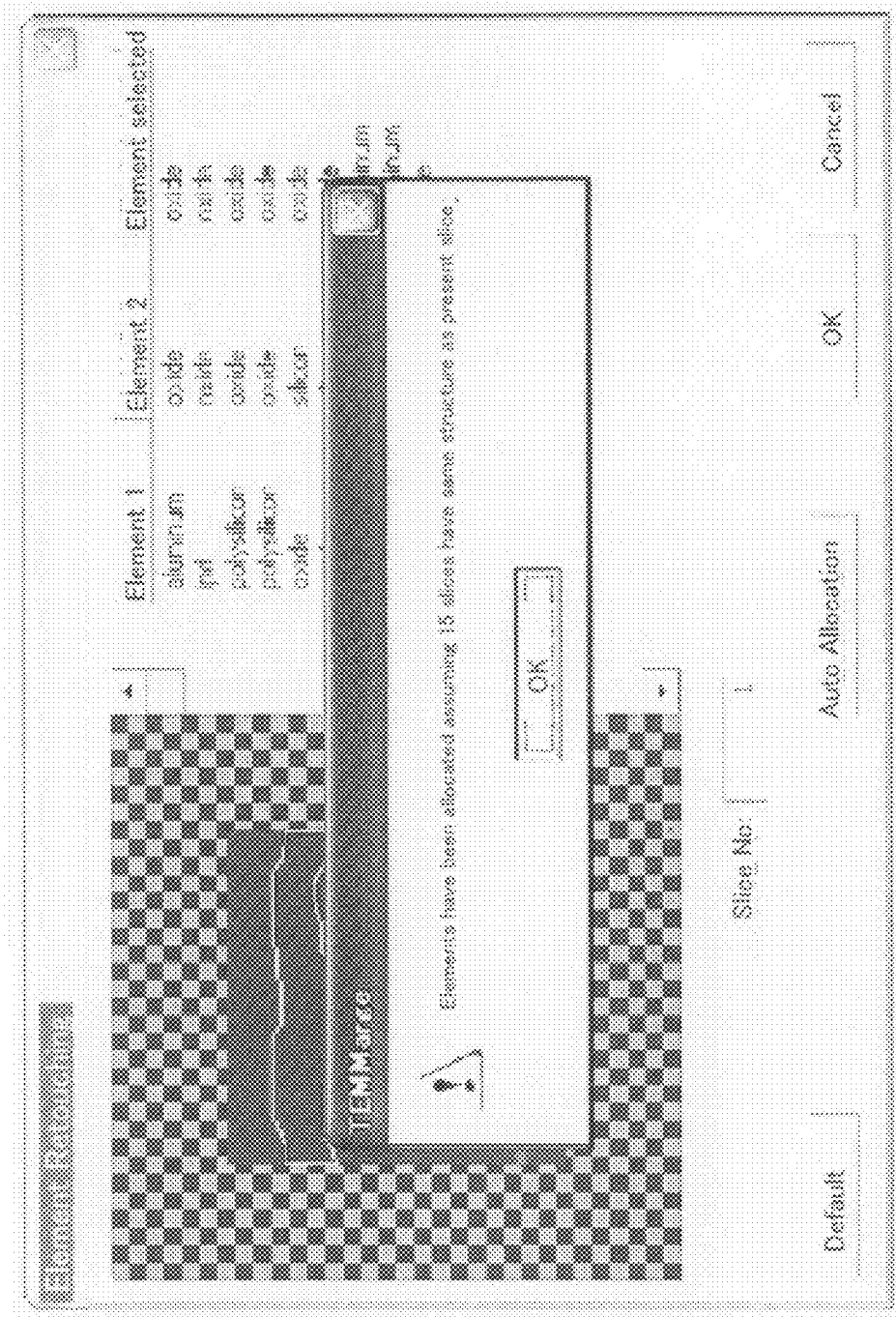
FIG. 23 is a diagram showing one example of a dialog to be displayed upon termination of the processing after having executed the automatic allocation in the first embodiment.

It is noted that the above-noted automatic allocation is executable, for example, by a process having the steps of providing an automatic allocation (or auto allocation) button 248 on the retouching processing window screen shown in FIG. 21, and allowing the user to click on this button. FIG. 23 shows one example of a dialog to be displayed upon termination of the processing after having executed the automatic allocation.

Figure 24:
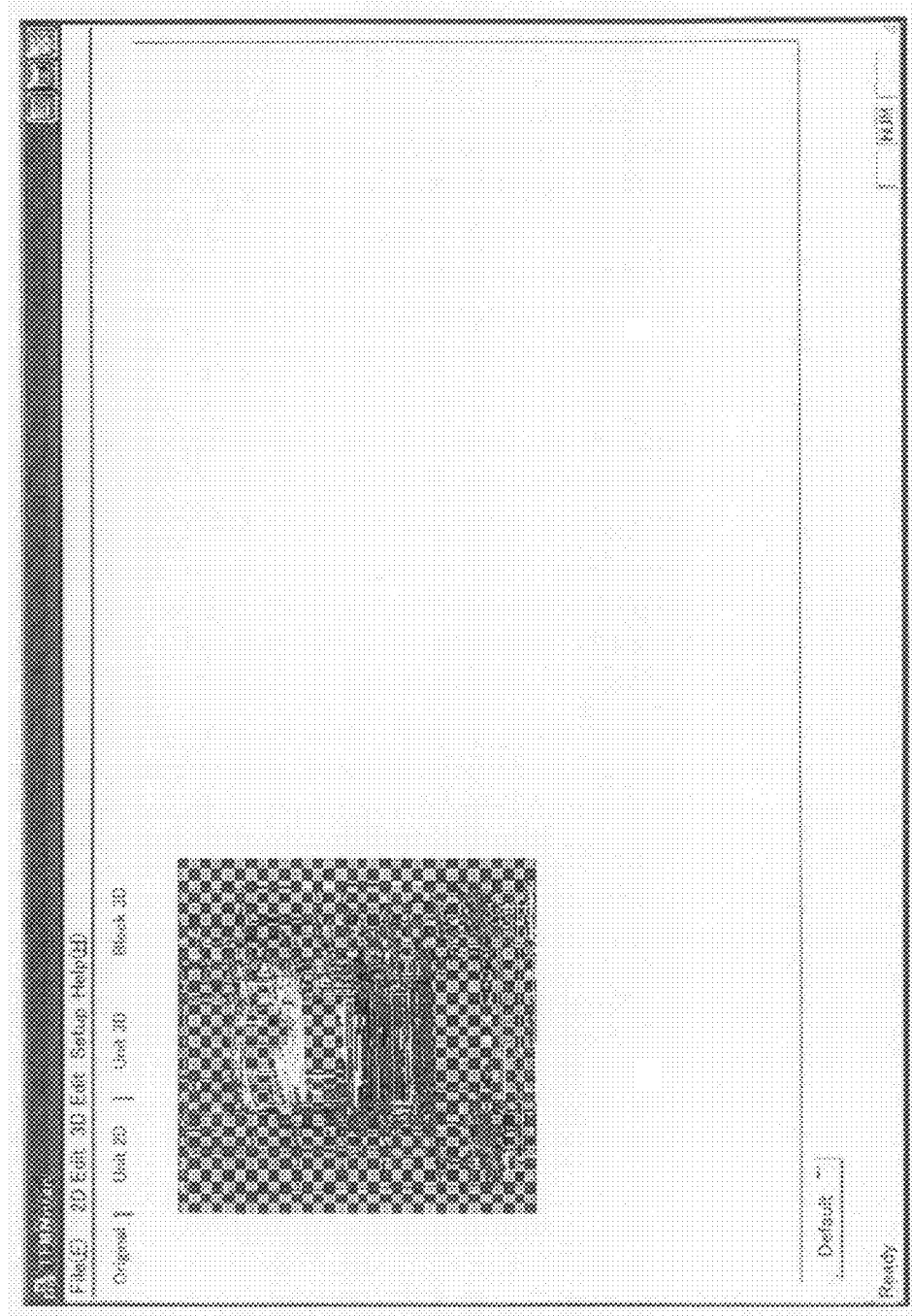
FIG. 24 is a diagram showing a screen which displays a wireframe image that is created from mesh data in the first embodiment.

When the retouching processing is completed, what is done next is to create mesh data. This mesh data creation is performed by using a known mesh data creation method with respect to the 3D structure data that was created by the retouching processing. FIG. 24 shows a window screen which displays a wireframe image which is created from the mesh data.

According to this embodiment stated above, it is possible to readily create 3D structure data from only two 2D cross-section images. In particular, the use of GUI for aiding the user makes it possible to further facilitate the creation of 3D structure data required.

Also importantly, by performing device simulation while using as input data therefor the 3D structure data thus formed in this embodiment, it becomes possible to extract device characteristics corresponding to the 3D shape of a actual or "real" device. Use of the device characteristics makes it possible to execute calibration of a compact model with 3D shape-use parameters incorporated or "packed" therein. By the calibration with 3D shape deviations taken therein, high-accuracy circuit simulation becomes enabled even if device miniaturization further advances in near future.

Note that in this embodiment, a new unit graphic may be formed by performing the processing for vertical or horizontal flipping of either one of the two unit graphics or the both of them. This method is effective in the case of comparing to each other the structures of two symmetrical memory cells existing in the same memory array.

Also note that when displaying on an image the TEM cross-section diagram(s), unit graphic(s) and 3D structure's cross-section image(s) or else, the system may be designed to have the GUI function for measurement of a distance between any given two points designated. With this function, an effect is obtainable which makes easier the user's grasp of planar images and 3D structures.

Alternatively, in the case of the TEM sectional images and unit graphics plus 3D structure sectional image(s) being displayed on the image, the system may be designed to have GUI functionality for measuring angles formed by polygonal lines connecting together any given three points designated. With this function also, it is possible to make easier the user's visual recognition of planar images and 3D structures.

Second Embodiment

A 3D structure data creation method in accordance with second embodiment of this invention is similar to the first embodiment, except that the images of the first and second 2D cross-sections prepared are composite photographs, each of which is composed by applying inside part removal or "mid cropping" processing to a TEM cross-section photograph of a semiconductor device. Thus, a repetitive explanation thereof is eliminated herein.

Figure 25:
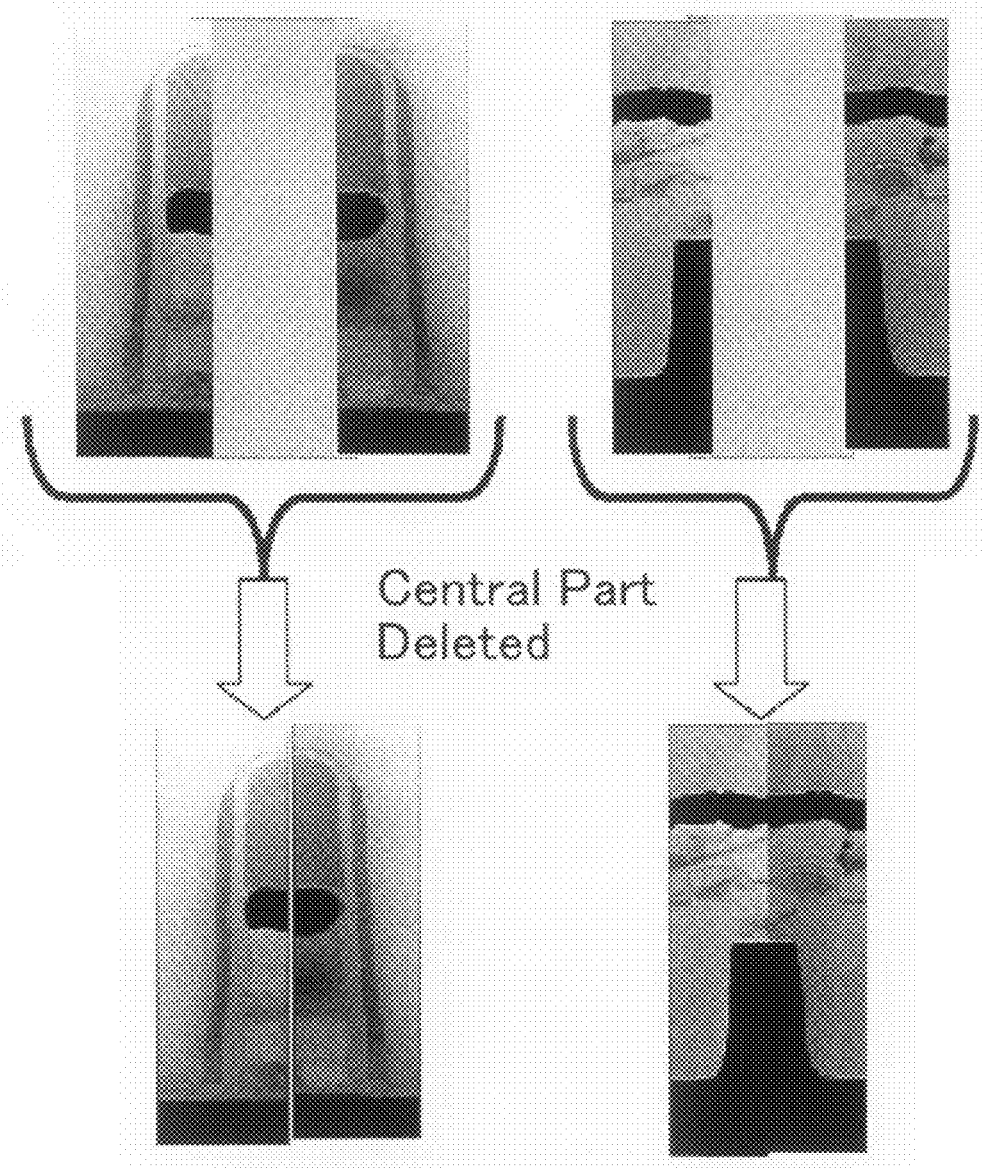
FIG. 25 is a diagram for explanation of mid-cropping of a second embodiment.
Figure 26A:
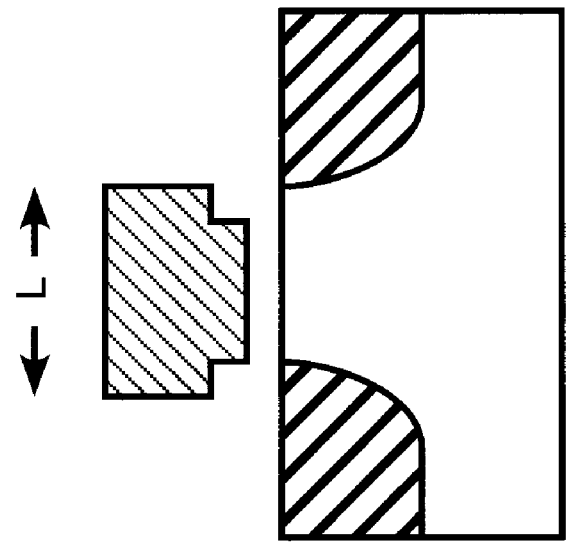
FIGS. 26A and 26B are diagrams for explanation of shape dependency of device characteristics.
Figure 26B:
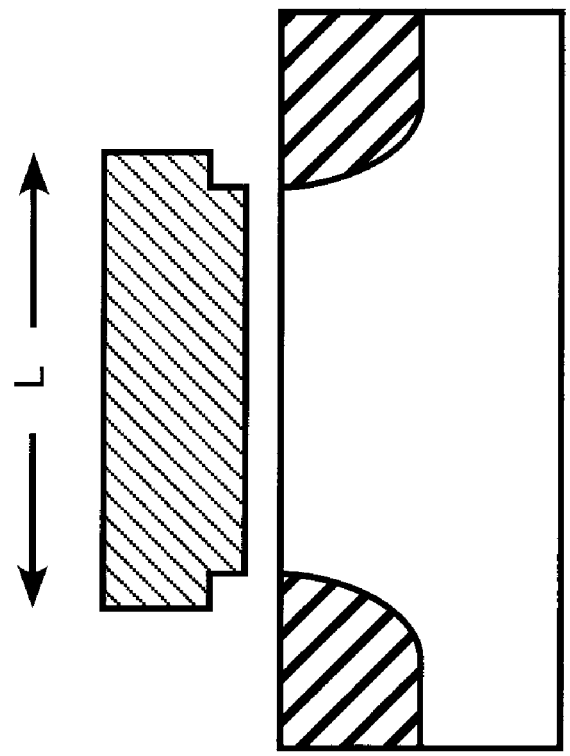
Figure 27A:
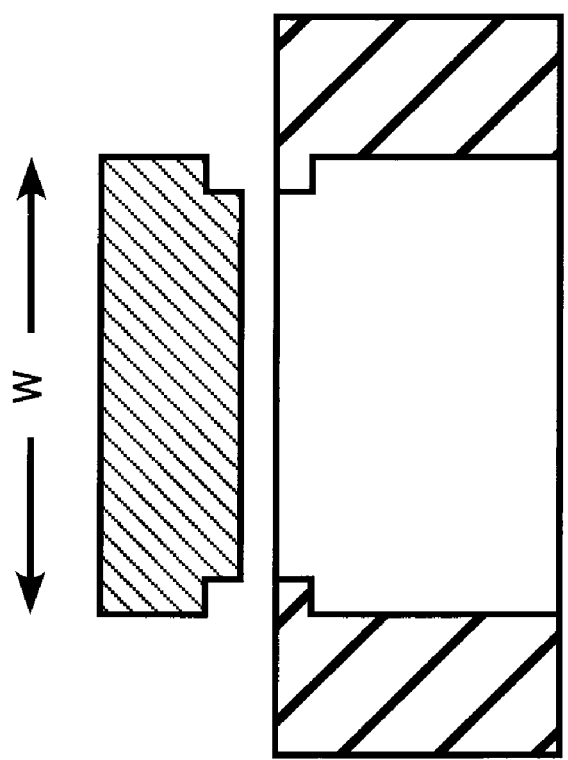
FIGS. 27A-27B are diagrams for explanation of shape dependency of device characteristics.
Figure 27B:
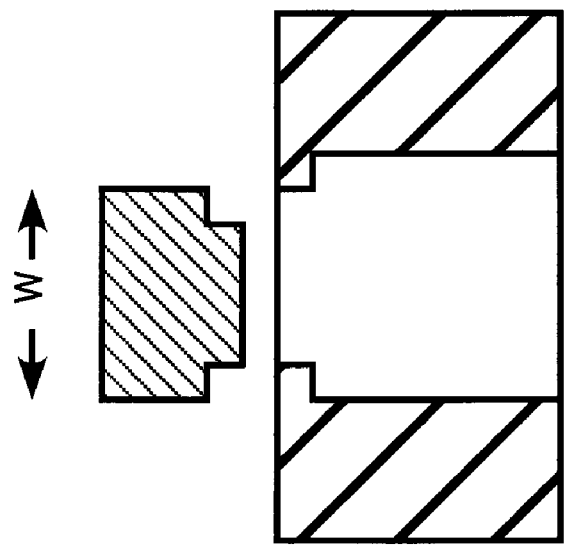
Figure 28A:
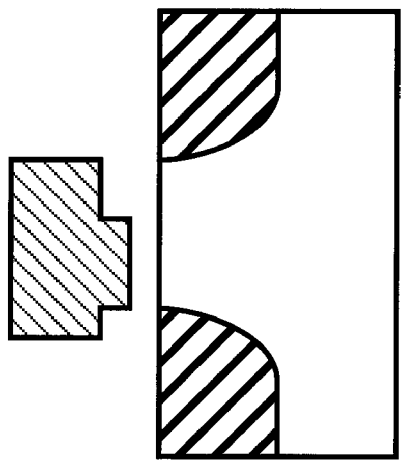
FIGS. 28A-28C are diagrams which explain that deviation of the device characteristics occurrable due to a deviation of shape becomes greater with advances in device miniaturization.
Figure 28B:
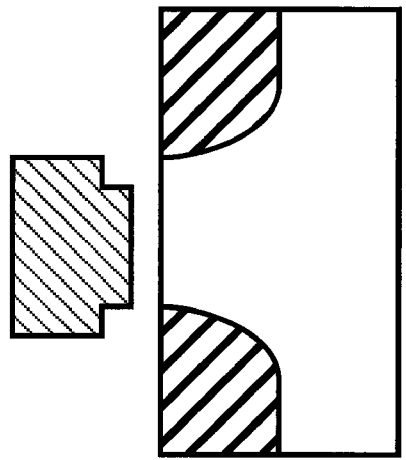
Figure 28C:
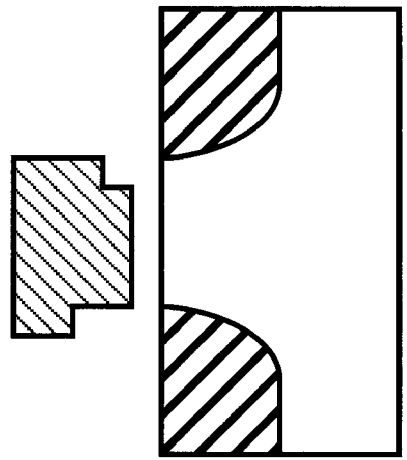

FIG. 25 is a diagram for explanation of the mid-crop processing. First, two TEM cross-section photographs are prepared, each of which is for use as the base of a unit graphic. Here, a memory cell of NAND flash memory device is shown as an example in a similar way to the first embodiment.

After a central portion is removed away from each of the two TEM sectional photographs, the remaining right and left parts are combined or "pasted" together. Thereafter, the unit graphic formation is performed by a similar method to that of the first embodiment. Note here that in this embodiment, a device sample is manufactured by a process flow which assumes the use of LSI fabrication processes of the next generation.

According to this embodiment, it is possible to create 3D structure data of the next-generation processes prior to the realization of lithography for LSI chips of the next generation. Thus it is possible to acquire by simulation the device characteristics of next-generation LSIs before establishment of the lithography.

Third Embodiment

A 3D structure data creation method of third embodiment of the invention is similar to the first embodiment except that the unit graphic preparation is not based on TEM cross-section photographs. Thus, a prolix explanation thereof will be eliminated herein. In this embodiment, any one of a digitized drawing which was prepared by one of the currently existing graphics image creation software applications and a hand-written drawing is used as the 2D cross-section image that becomes the basis of the unit graphic creation.

According to this embodiment, it is possible to make 3D structure data without having to actually perform trial production of a device sample(s). Thus it is possible to perform the simulation of 3D shape-considered LSI device characteristics, more readily when compared to the first embodiment.

Fourth Embodiment

A 3D structure data creation apparatus of fourth embodiment of this invention is the one that employs GUI for assisting the user in the process of creating the data of a 3D structure which is constituted from a plurality of different circuit elements. This embodiment apparatus includes a unit graphic creation screen generation/display device for displaying an image of first 2D cross-section of the 3D structure and an image of second 2D cross-section of the 3D structure which is different in normal vector from the first 2D cross-section and for enabling, in response to receipt of range designation of the user, preparation of a first unit graphic based on the first 2D cross-section image and preparation of a second unit graphic based on the second 2D cross-section image. The apparatus also includes a labeling processing screen generation/display device for displaying the first and second unit graphics and for enabling the user to partition each of the first and second unit graphics on a per-element basis. The apparatus further includes a 3D conversion device for performing layout positioning of the first unit graphic and the second unit graphic in accordance with respective normal vectors and for extending or stretching the partitioned first unit graphic in the normal line direction of first cross-section diagram to thereby perform 3D conversion while simultaneously stretching the partitioned second unit graphic in the normal line direction of second cross-section diagram to thereby perform 3D conversion. The apparatus also includes an automatic allocation device for automatically allocating an identical element to a region in which elements of the 3D-converted first and second unit graphics are identical to each other in those regions in which respective partitioned portions of the 3D-converted first unit graphic and respective partitioned portions of the 3D-converted second unit graphic intersect together. The apparatus further includes a retouching processing screen generation/display device for enabling allocation of either one of the elements of the partitioned portions of the first and second unit graphics, which is selected by the user, to a region in which the elements of the first and second unit graphics are not identical to each other in the above-noted regions in which respective partitioned portions of the 3D-converted first unit graphic and respective partitioned portions of the 3D-converted second unit graphic cross together.

FIG. 2 shows, in schematical block diagram form, the configuration of the 3D structure data creation apparatus of this embodiment. As has been explained in the first embodiment, the 3D structure data creation apparatus 100 is generally made up of the control unit 102, storage unit 104, display unit 106, and input unit 106.

The 3D structure data creation apparatus of this embodiment is the one that realizes the 3D structure data creation method which has been explained in the first embodiment. This apparatus has the control unit 102 as the device for generating the unit graphic creation window screen, the labeling processing window screen and the retouching processing window screen, which have been discussed in the first embodiment. In addition, it has the control unit 102 as the device for generating the retouching processing screen that was explained in the first embodiment. It has the display unit 106 as the display device for displaying the unit graphic creation screen, the labeling processing screen and the retouching processing screen. Additionally the control unit 102 functions also as the above-noted 3D conversion device and the automatic allocation device.

Note that it is important for the user in order to make easier the 3D structure data creation that the apparatus is specifically arranged to have a generation device that generates three kinds of GUI window screens, i.e., the unit graphic creation screen, the labeling processing screen and the retouching processing screen, although it is desirable in a view point of the user assistance that the apparatus be arranged to have a generation device that generates other GUI window screens which have been stated in the first embodiment—namely, the volume graphic display screen, the 2D cross-section image adjustment screen, the scale determination screen, and the element allocation screen or the like.

Fifth Embodiment

A computer-readable recording medium in accordance with fifth embodiment of this invention is characterized in that it stores therein a computer program for causing a computer to execute the 3D structure data creation process of the first embodiment. Examples of the recording media include, but not limited to, a floppy diskette (FD), hard disk drive (HDD), optical disk, magneto-optic (MO) disk, compact disc read only memory (CD-ROM), CD recordable (CD-R), CD rewritable (CD-RW), magnetic tape, nonvolatile memory card, ROM, and digital versatile disk (DVD), such as DVD-ROM, DVD-R, etc. By causing the computer program stored in the computer-readable record media of this embodiment to operate on a desired computer, it becomes possible to readily create 3D structure data.

Sixth Embodiment

A computer system of sixth embodiment of the invention is characterized by estimating or predicting the device characteristics based on input mesh-formed 3D structure data created by using the 3D structure data creation method of the first embodiment. The computer system of this embodiment is arranged, for example, to have a hardware configuration which is similar to the 3D structure data creation apparatus shown in FIG. 2. An application software for execution of device simulation is installed in the storage unit 104. The input unit 108 has a function of inputting 3D structure data. The control unit 102 executes computation of the device simulation. Predicted device characteristics obtained as the result of such device simulation are displayed by the display unit 106. With the computer system of this embodiment, it becomes possible to readily execute the prediction of the device characteristics with 3D shapes being taken into consideration.

Although several embodiments of the present invention have been explained with reference to practical examples thereof, the embodiments are disclosed as mere examples and do not limit the invention. In addition, while in the description of the embodiments an explanation is omitted of those parts or components which are not directly required for the explanation of this invention in terms of the 3D structure data creation method, 3D structure data creation apparatus, computer program, computer-readable recording media and computer system, it is possible to arbitrarily select, for practical use, any necessary elements concerning the 3D structure data creation method, 3D structure data creation apparatus, computer program, computer-readable recording media and computer system.

Also note that all possible 3D structure data creation methods, 3D structure data creation apparatuses, computer programs, computer-readable recording media and computer systems, which comprise the subject matter of this invention and which are arbitrarily modifiable and design-changeable by a person skilled in the art, are interpreted to be included within the scope of this invention. The invention is, therefore, to be limited only as indicated by the scope of the appended claims, with any possible equivalents thereof being involved therein.

What is claimed is:

1. A method for creating three-dimensional (3D) structural data of a 3D structure configured from a plurality of different elements by use of a graphical user interface (GUI), the method comprising:

visually displaying on a unit graphic creation screen a first two-dimensional (2D) cross-section image of the 3D structure and a second 2D cross-section image of the 3D structure different in normal vector from the first 2D cross-section;

forming, in response to receipt of range specification by a user, a first unit graphic based on the first 2D cross-section image and a second unit graphic based on the second 2D cross-section image;

displaying the first and second unit graphics on a labeling processing screen for permitting the user to partition the first and second unit graphics on a per-element basis;

performing layout positioning of the first and second unit graphics in accordance with respective normal vectors thereof;

expanding the partitioned first unit graphic in the normal direction of the first 2D cross-section image to thereby convert it into a 3D object;

expanding the partitioned second unit graphic in the normal direction of the second 2D cross-section image to thereby convert it to a 3D object;

allocating in an automated way an identical element to a region in which an element of the 3D-converted first unit graphic and an element of the 3D-converted second unit graphic coincide with each other in regions with intersection of respective partitioned portions of the 3D-converted first unit graphic and respective partitioned portions of the 3D-converted second unit graphic; and when another region in which an element of the 3D-converted first unit graphic and an element of the 3D-converted second unit graphic fail to coincide with each other is present in regions with intersection of respective partitioned portions of the 3D-converted first unit graphic and respective partitioned portions of the 3D-converted second unit graphic, allowing a user to allocate to the another region on a retouching processing screen any selected one of the elements of the partitioned portions of the 3D-converted first and second unit graphics, wherein the first and second 2D cross-section images prepared are simultaneously displayed on a 2D sectional image adjustment screen for allowing the user to perform scale adjustment and position adjustment of the first and second 2D cross-section images.

2. The method according to claim 1, wherein the data of the 3D structure is a set of mesh data readable into a simulator.

3. The method according to claim 1, wherein each of the first 2D cross-section image and the second 2D cross-section image is a sectional transmission electron microscope (TEM) photograph of a semiconductor device.

4. The method according to claim 1, wherein each of the first 2D cross-section image and the second 2D cross-section image is a composite photograph as obtained by cropping inside part of a sectional TEM photograph of a semiconductor device.

5. The method according to claim 1, wherein the scale adjustment and the position adjustment are performed by a process including displaying two parallel lines on the 2D sectional image adjustment screen and allowing the user to move, shrink or enlarge any one of the first and second 2D cross-section images in such a way that corresponding portions of the first and second 2D cross-section images become identical to the two parallel lines respectively.

6. The method according to claim 1, wherein on the labeling processing screen, the partitioning is performed by the user in such a way as to draw a boundary line for bordering at any one of the first unit graphic and the second unit graphic to thereby cause a region partitioned by the boundary line to be recognized as a continuous area.

7. The method according to claim 6, wherein any one of the first unit graphic and the second unit graphic partitioned on the labeling processing screen is displayed on an element allocation screen while allowing the user to assign his or her preferred elements to the partitioned regions, respectively.

8. The method according to claim 1, further comprising: displaying on a volume graphic display screen a volume graphic obtained by composition of data being 3D-converted by expanding the partitioned first unit graphic in a normal line coordinate axis direction of the first 2D cross-section image and data being 3D-converted by expanding the partitioned second unit graphic in a normal line coordinate axis direction of the second 2D cross-section image.

9. The method according to claim 8, wherein on the volume graphic display screen, the volume graphic is rotatable, movable in parallel, expandable or shrinkable by the user.

10. The method according to claim 8, wherein on the volume graphic display screen, the volume graphic is changeable in image resolution by the user.

11. The method according to claim 8, wherein on the volume graphic display screen, it is possible by the user to display a 2D sectional diagram at any given position of the volume graphic and in any given normal line direction.

12. The method according to claim 8, wherein on the volume graphic display screen, it is possible by the user to make non-visible any given element or any given region of the volume graphic.

13. The method according to claim 8, further comprising: continuously displaying on the retouching processing screen a 2D cross-sectional diagram along either one of the coordinate axes of the volume graphic by performing parallel movement of a display position thereof at pre-specified intervals for allowing a user to allocate to the another region on a retouching processing screen any selected one of the elements of the partitioned portions of the 3D-converted first and second unit graphics when the another region in which an element of the 3D-converted first unit graphic and an element of the 3D-converted second unit graphic fail to coincide with each other is present in regions with intersection of respective partitioned portions of the 3D-converted first unit graphic and respective partitioned portions of the 3D-converted second unit graphic.

14. The method according to claim 13, wherein when one of 2D sectional diagrams being continuously displayed is the same in geometry as its previous 2D sectional diagram, an element which is the same as the previous 2D sectional diagram is allocated to each partitioned portion in an automated way.

15. The method according to claim 1, further comprising: verifying a image of the 3D structure data created by displaying on a volume display screen the image of the 3D structure data.

16. The method according to claim 15, wherein on the volume graphic display screen, the image of the 3D structure data is rotatable, movable in parallel, expandable or shrinkable by the user.

17. The method according to claim 15, wherein on the volume graphic display screen, the image of the 3D structure data is changeable in image resolution by the user.

18. The method according to claim 15, wherein on the volume graphic display screen, it is possible by the user to display a 2D sectional diagram at any given position of the image of the 3D structure data and in any given normal line direction.

19. A method for creating three-dimensional (3D) structural data of a 3D structure configured from a plurality of different elements by use of a graphical user interface (GUI), the method comprising:

visually displaying on a unit graphic creation screen a first two-dimensional (2D) cross-section image of the 3D structure and a second 2D cross-section image of the 3D structure different in normal vector from the first 2D cross-section;

forming, in response to receipt of range specification by a user, a first unit graphic based on the first 2D cross-section image and a second unit graphic based on the second 2D cross-section image;

displaying the first and second unit graphics on a labeling processing screen for permitting the user to partition the first and second unit graphics on a per-element basis;

performing layout positioning of the first and second unit graphics in accordance with respective normal vectors thereof;

expanding the partitioned first unit graphic in the normal direction of the first 2D cross-section image to thereby convert it into a 3D object;

expanding the partitioned second unit graphic in the normal direction of the second 2D cross-section image to thereby convert it to a 3D object;

allocating in an automated way an identical element to a region in which an element of the 3D-converted first unit graphic and an element of the 3D-converted second unit graphic coincide with each other in regions with intersection of respective partitioned portions of the 3D-converted first unit graphic and respective partitioned portions of the 3D-converted second unit graphic; and when another region in which an element of the 3D-converted first unit graphic and an element of the 3D-converted second unit graphic fail to coincide with each other is present in regions with intersection of respective partitioned portions of the 3D-converted first unit graphic and respective partitioned portions of the 3D-converted second unit graphic, allowing a user to allocate to the another region on a retouching processing screen any selected one of the elements of the partitioned portions of the 3D-converted first and second unit graphics, wherein on the unit graphic creation screen, the user is allowed to find two rectangular regions being displayed on respective images of the first 2D cross-section image and the second 2D cross-section image and to adjust to his or her desired size a size of each of the two rectangular regions with two opposite sides of a one rectangular region moving in association with two opposite sides of a remaining rectangular region to thereby extract by cutaway the first unit graphic and the second unit graphic to be used for creation of the 3D structure data.

20. A method for creating three-dimensional (3D) structural data of a 3D structure configured from a plurality of different elements by use of a graphical user interface (GUI), the method comprising:

visually displaying on a unit graphic creation screen a first two-dimensional (2D) cross-section image of the 3D structure and a second 2D cross-section image of the 3D structure different in normal vector from the first 2D cross-section;

forming, in response to receipt of range specification by a user, a first unit graphic based on the first 2D cross-section image and a second unit graphic based on the second 2D cross-section image;

displaying the first and second unit graphics on a labeling processing screen for permitting the user to partition the first and second unit graphics on a per-element basis;

performing layout positioning of the first and second unit graphics in accordance with respective normal vectors thereof;

expanding the partitioned first unit graphic in the normal direction of the first 2D cross-section image to thereby convert it into a 3D object;

expanding the partitioned second unit graphic in the normal direction of the second 2D cross-section image to thereby convert it to a 3D object;

allocating in an automated way an identical element to a region in which an element of the 3D-converted first unit graphic and an element of the 3D-converted second unit graphic coincide with each other in regions with intersection of respective partitioned portions of the 3D-converted first unit graphic and respective partitioned portions of the 3D-converted second unit graphic;

displaying on a scale determination screen either one of the first unit graphic and the second unit graphic;

permitting the user to designate two points on any one of the first unit graphic and the second unit graphic;

allowing the user to set up a distance between the two points to thereby determine a scale of the first unit graphic and the second unit graphic; and when another region in which an element of the 3D-converted first unit graphic and an element of the 3D-converted second unit graphic fail to coincide with each other is present in regions with intersection of respective partitioned portions of the 3D-converted first unit graphic and respective partitioned portions of the 3D-converted second unit graphic, allowing a user to allocate to the another region on a retouching processing screen any selected one of the elements of the partitioned portions of the 3D-converted first and second unit graphics.

* * * * *